(12) United States Patent
Choi et al.

(10) Patent No.: US 11,784,285 B2
(45) Date of Patent: Oct. 10, 2023

(54) THREE DIMENSIONALLY STRUCTURED SEMICONDUCTOR LIGHT EMITTING DIODE AND DISPLAY APPARATUS

(71) Applicant: SAMSUNG ELECTRONICS CO., LTD., Suwon-si (KR)

(72) Inventors: Youngjin Choi, Seoul (KR); Joosung Kim, Seongnam-si (KR); Jonguk Seo, Suwon-si (KR); Sungjin Ahn, Hwaseong-si (KR); Donggun Lee, Hwaseong-si (KR); Jeongwook Lee, Yongin-si (KR); Yongseok Choi, Suwon-si (KR); Youngjo Tak, Suwon-si (KR); Jonghoon Ha, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 303 days.

(21) Appl. No.: 17/022,496

(22) Filed: Sep. 16, 2020

(65) Prior Publication Data
US 2021/0242369 A1 Aug. 5, 2021

(30) Foreign Application Priority Data
Feb. 4, 2020 (KR) .................... 10-2020-0013017

(51) Int. Cl.
*H01L 33/20* (2010.01)
*H01L 33/38* (2010.01)
(Continued)

(52) U.S. Cl.
CPC .......... *H01L 33/20* (2013.01); *H01L 27/156* (2013.01); *H01L 33/387* (2013.01); *H01L 33/42* (2013.01); *H01L 21/0254* (2013.01); *H01L 33/12* (2013.01)

(58) Field of Classification Search
CPC ..... H01L 33/20; H01L 27/156; H01L 33/387; H01L 33/42; H01L 33/007;
(Continued)

(56) References Cited

U.S. PATENT DOCUMENTS 6,372,608 B1  4/2002 Shimoda et al.
6,645,830 B2  11/2003 Shimoda et al.
(Continued)

FOREIGN PATENT DOCUMENTS

JP           4927223 B2    5/2012
WO   WO 2012/148231 A2   11/2012

*Primary Examiner* — Patricia D Valenzuela
(74) *Attorney, Agent, or Firm* — Lee IP Law, P.C.

(57) ABSTRACT

A three-dimensionally structured semiconductor light emitting diode includes a first conductivity-type semiconductor rod having integral first and second portions, the first portion defining a first surface, the second portion defining a second surface opposite the first surface, and a side surface between the first and second surfaces, an active layer and a second conductivity-type semiconductor layer on the side surface of the first conductivity-type semiconductor rod, the active layer and the second conductivity-type semiconductor layer being on the second portion of the first conductivity-type semiconductor rod, an insulating cap layer on the second surface of the first conductivity-type semiconductor rod, a transparent electrode layer on the second conductivity-type semiconductor layer, and a passivation layer on the transparent electrode layer and exposing a portion of the transparent electrode layer, the passivation layer extending to cover ends of the active layer and the second conductivity-type semiconductor layer adjacent to the first surface.

18 Claims, 16 Drawing Sheets

(51) Int. Cl.
  *H01L 27/15* (2006.01)
  *H01L 33/42* (2010.01)
  *H01L 21/02* (2006.01)
  *H01L 33/12* (2010.01)

(58) Field of Classification Search
  CPC ..... H01L 33/0075; H01L 33/44; H01L 33/62; H01L 33/24; H01L 33/18; H01L 25/0753; H01L 25/167; H01L 33/08; H01L 33/38; H01L 33/52; H01L 33/12; H01L 21/0254
  See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,331,233 B2 | 5/2016 | Dussaigne et al. | |
| 9,461,199 B2 | 10/2016 | Heo et al. | |
| 9,882,086 B2 | 1/2018 | Romano et al. | |
| 10,290,768 B2 | 5/2019 | Banna et al. | |
| 10,396,121 B2 | 8/2019 | Jacob et al. | |
| 2002/0063258 A1* | 5/2002 | Motoki | H01L 33/32 257/79 |
| 2011/0254043 A1* | 10/2011 | Negishi | H01L 33/20 438/22 |
| 2013/0221385 A1 | 8/2013 | Shibata et al. | |
| 2014/0327037 A1* | 11/2014 | Dussaigne | H01L 21/0254 257/431 |
| 2015/0207038 A1* | 7/2015 | Hwang | H01L 33/405 257/88 |
| 2017/0323925 A1* | 11/2017 | Schneider, Jr. | H01L 33/007 |
| 2017/0365751 A1* | 12/2017 | Butendeich | H01L 33/08 |
| 2018/0019377 A1 | 1/2018 | Kim et al. | |

\* cited by examiner

THREE DIMENSIONALLY STRUCTURED SEMICONDUCTOR LIGHT EMITTING DIODE AND DISPLAY APPARATUS

CROSS-REFERENCE TO RELATED APPLICATION

Korean Patent Application No. 10-2020-0013017, filed on Feb. 4, 2020, in the Korean Intellectual Property Office, and entitled: "Three Dimensionally Structured Semiconductor Light Emitting Diode and Display Apparatus," is incorporated by reference herein in its entirety.

BACKGROUND

1. Field

Example embodiments relate to a three-dimensionally structured semiconductor light emitting diode and a display apparatus using the same.

2. Description of the Related Art

A semiconductor light emitting diode (LED) has been used as a light source for a lighting device and also as a light source of various electronic products. For example, a semiconductor LED has been used as a light source for various display devices, e.g., a television (TV), a mobile phone, a personal computer (PC), a laptop PC, a personal digital assistant (PDA), and the like.

For example, a general display device may include a display panel implemented by a liquid crystal display (LCD) and a backlight. Recently, a display device has also been developed to use a LED device as a pixel, such that a backlight may not be required. Such a display device may have a compact size, and may be implemented as a high luminance display device having improved luminous efficiency, e.g., as compared to a general LCD.

SUMMARY

According to an example embodiment, a three-dimensionally structured semiconductor light emitting diode includes a first conductivity-type semiconductor rod having first and second portions integral with each other, the first portion defining a first surface, the second portion defining a second surface opposite the first surface, and a side surface extending between the first surface and the second surface, an active layer and a second conductivity-type semiconductor layer sequentially disposed on the side surface of the first conductivity-type semiconductor rod, the active layer and the second conductivity-type semiconductor layer being on the second portion of the first conductivity-type semiconductor rod, an insulating cap layer on the second surface of the first conductivity-type semiconductor rod, a transparent electrode layer on the second conductivity-type semiconductor layer, and a passivation layer on the transparent electrode layer and exposing a portion of the transparent electrode layer, the passivation layer extending to cover a first end of the active layer and a first end of the second conductivity-type semiconductor layer adjacent to the first surface.

According to an example embodiment, a three-dimensionally structured semiconductor light emitting diode includes a first conductivity-type semiconductor rod having a first surface and a second surface opposing each other and a side surface disposed between the first surface and the second surface, and divided into a first portion adjacent to the first surface and a second portion adjacent to the second surface, an active layer and a second conductivity-type semiconductor layer sequentially disposed on a side surface of the second portion of the first conductivity-type semiconductor rod, an insulating cap layer disposed on the second surface of the first conductivity-type semiconductor rod, a transparent electrode layer disposed on the insulating cap layer and extending to a surface of the second conductivity-type semiconductor layer, and a passivation layer disposed on the transparent electrode layer to expose a portion of the transparent electrode layer disposed on the insulating cap layer.

According to an example embodiment, a display device includes a plurality of pixels, a first electrode portion and a second electrode portion disposed in the plurality of pixels, respectively, and spaced apart from each other, and a three-dimensionally structured semiconductor light emitting diode disposed between the first electrode portion and the second electrode portion in a length direction for a first surface of a first conductivity-type semiconductor nano-rod and a transparent electrode layer to be electrically connected to the first electrode portion and the second electrode portion, respectively.

According to an example embodiment, a method of manufacturing a three-dimensionally structured semiconductor light emitting diode includes forming a first conductivity-type semiconductor layer on a substrate, forming a plurality of internal rods using a plurality of nitride cap layers as masks, where the plurality of internal rods are disposed on a remaining first conductivity-type semiconductor layer, forming a plurality of first conductivity-type semiconductor rods by regrowing a first conductivity-type semiconductor on side surfaces of the plurality of internal rods, forming a plurality of three-dimensional light emitting structures by forming an active layer and a second conductivity-type semiconductor layer on side surfaces of the plurality of first conductivity-type semiconductor rods, forming a transparent electrode layer on an upper surface of each of the plurality of insulating cap layers and a surface of the second conductivity-type semiconductor layer, etching the remaining first conductivity-type semiconductor layer disposed between the plurality of three-dimensional light emitting structures, forming a passivation layer on the transparent electrode layer to expose a portion of the transparent electrode layer, and cutting out an etched portion of the plurality of first conductivity-type semiconductor rods.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
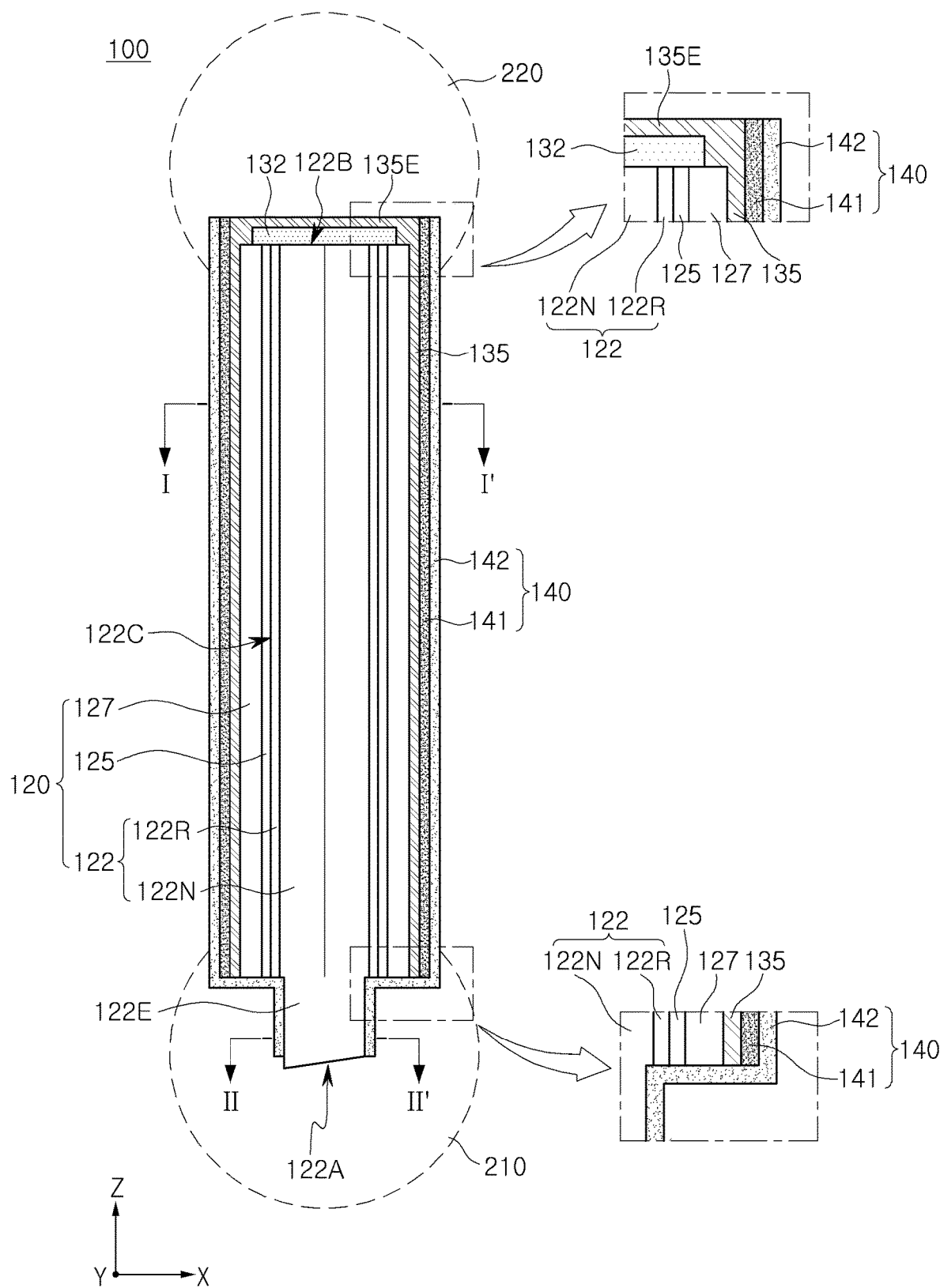
FIG. 1 is a lateral cross-sectional diagram illustrating a three-dimensionally structured semiconductor light emitting diode according to an example embodiment.
Figure 2A:
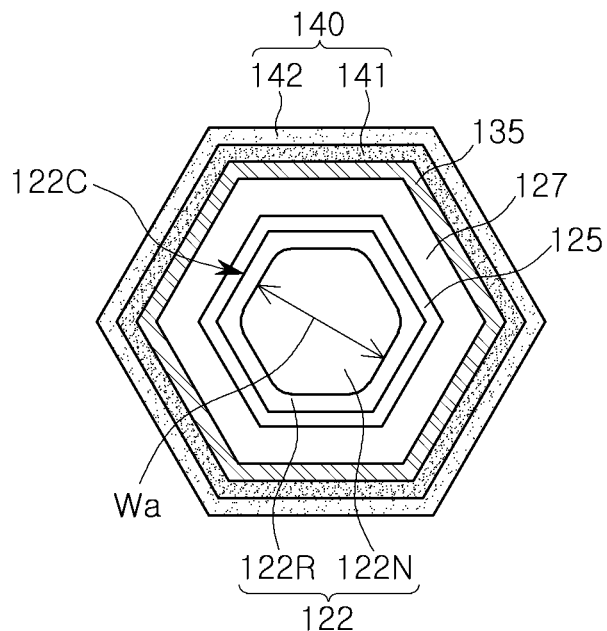
FIGS. 2A and 2B are cross-sectional diagrams illustrating top views of cross-sections along lines I-I' and II-II' in FIG. 1, respectively.
Figure 2B:
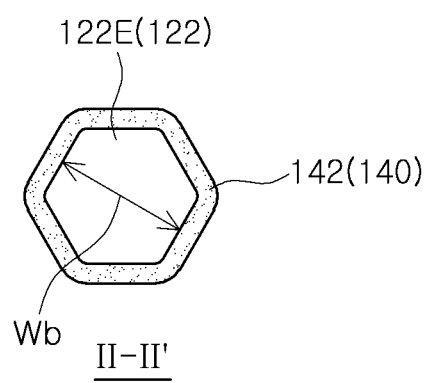

FIG. 1 is a lateral cross-sectional diagram illustrating a three-dimensionally structured semiconductor light emitting diode according to an example embodiment. FIGS. 2A and 2B are top cross-sectional views along line I-I' and II-II' in FIG. 1, respectively.

Referring to FIGS. 1, 2A, and 2B, a three-dimensionally structured semiconductor light emitting diode 100 may include a light emitting structure 120 including a first conductivity-type semiconductor rod 122, an active layer 125, and a second conductivity-type semiconductor layer 127 sequentially stacked. The first conductivity-type semiconductor rod 122 may include a first surface 122A, a second surface 122B opposite the first surface 122A, and a side surface 122C extending between the first surface 122A and the second surface 122B, and the active layer 125 and the second conductivity-type semiconductor layer 127 may be sequentially stacked on the side surface 122C of the first conductivity-type semiconductor rod 122.

In detail, referring to FIG. 1, the light emitting structure 120 may have a core-shell structure. The first conductivity-type semiconductor rod 122 may provide a core, e.g., a rod-shaped or cylindrical-shaped structure, and the active layer 125 and the second conductivity-type semiconductor layer 127 may provide a shell, e.g., the active layer 125 and the second conductivity-type semiconductor layer 127 may be layers on and completely surrounding the side surface 122C of the first conductivity-type semiconductor rod 122. For example, as illustrated in FIG. 1, a width of the first conductivity-type semiconductor rod 122 along the X direction may be larger than a width of each of the active layer 125 and the second conductivity-type semiconductor layer 127 along the X direction.

Referring to FIG. 1, the active layer 125 and the second conductivity-type semiconductor layer 127 may not be disposed on a portion 122E of the first conductivity-type semiconductor rod 122 adjacent to the first surface 122. For example, as illustrated in FIG. 1, the portion 122E may be a portion of the first conductivity-type semiconductor rod 122 that protrudes in the Z direction, e.g., below the side surface 122C, and has a smaller width along the X direction e.g., as compared to a width along the X direction between facing portions of the side surface 122C. As illustrated in FIG. 1, the active layer 125 and the second conductivity-type semiconductor layer 127 may be disposed on a portion of the first conductivity-type semiconductor rod 122 other than the portion 122E, e.g., on the entire side surface 122C of the first conductivity-type semiconductor rod 122.

An active layer forming area may be sufficiently secured using the side surface 122C of the first conductivity-type semiconductor rod 122, e.g., without the portion 122E. For example, an aspect ratio of the first conductivity-type semiconductor rod 122 may be equal to or greater than 4. As the active layer 125 is formed on a single crystal plane, i.e., on the side surface 122C of the first conductivity-type semiconductor rod 122, color uniformity may be implemented.

The first conductivity-type semiconductor rod 122 in the example embodiment may include an internal rod 122N and a regrowth layer 122R disposed on a side surface of the internal rod 122N. For example, as illustrated in FIG. 1, the portion 122E may extend from and be integral with the internal rod 122N, e.g., the portion 122E and the internal rod 122N may be continuous with each other along the Z direction to define a single and seamless structure, and the regrowth layer 122R may extend on the side surface of the internal rod 122N without extending on the portion 122E. The regrowth layer 122R may include a first conductivity-type semiconductor that is the same as the internal rod 122N.

Referring to FIG. 2A, in the example embodiment, the internal rod 122N may have a hexagonal columnar structure having a hexagonal cross-sectional surface, in a top view, but an example embodiment thereof is not limited thereto. In example embodiments, a cross-sectional surface of the internal rod 122N may have a rounded shape such as a hexagonal shape without angular portions. A shape of the cross-sectional surface of the internal rod 122N may be determined by a wet etching process applied to a process of forming the first conductivity-type semiconductor rod 122 (see FIG. 5B). The regrowth layer 122R may be obtained by regrowing a first conductivity-type semiconductor on the side surface of the internal rod 122N, damaged by the etching process, by a metal organic chemical vapor deposition (MOCVD) process. By the regrowth layer 122R, the side surface 122C of the first conductivity-type semiconductor rod 122 may have a crystal plane (e.g., a non-polar surface) on which the active layer 125 having improved quality may be deposited.

In example embodiments, even when a cross-sectional surface of the internal rod 122N has a rounded shape, rather than a hexagonal shape, the first conductivity-type semiconductor rod 122 may have a hexagonal columnar shape having a hexagonal cross-sectional surface.

Referring to FIGS. 2A and 2B, the portion 122E (referred to as "a narrow portion" or "a portion to be cut out") of the first conductivity-type semiconductor rod 122 adjacent to, e.g., defining, the first surface 122A may have a width Wb (FIG. 2B) smaller than a width Wa (FIG. 2A) of the internal rod 122N above the portion 122E. The portion 122E adjacent to the first surface 122A may have a cross-sectional surface having a shape different from that of a cross-sectional surface of the other portion (i.e., the internal rod 122N) of the first conductivity-type semiconductor rod 122, e.g., the cross-sectional surface of the portion 122E may be a hexagon with sharp edges (FIG. 2B) as opposed to the hexagonal shape with rounded edges of the internal rod 122N (FIG. 2A). The configuration may result from a difference in thicknesses caused by the regrowth layer 122R and also a decrease of the width caused by applying an additional etching process (e.g., see FIG. 5H) to the portion 122E adjacent to the first surface 122A.

The light emitting structure 120 in the example embodiment, including the first conductivity-type semiconductor rod 122, the active layer 125, and the second conductivity-type semiconductor layer 127, may be nitride semiconductor single crystal.

The first conductivity-type semiconductor rod 122 may include nitride semiconductor satisfying N-type $In_xAl_yGa_{1-x-y}N$ ($0 \leq x < 1$, $0 \leq y < 1$, $0 \leq x+y < 1$), and an N-type impurity may be Si. For example, the first conductivity-type semiconductor rod 122 may include an N-type GaN layer. The second conductivity-type semiconductor layer 127 may be a nitride semiconductor layer satisfying a P-type $In_xAl_yGa_{1-x-y}N$ ($0 \leq x < 1$, $0 \leq y < 1$, $0 \leq x+y < 1$), and a P-type impurity may be Mg. In an example embodiment, the second conductivity-type semiconductor layer 127 may be implemented to have a single layer structure, but an example embodiment thereof is not limited thereto. In another example embodiment, the second conductivity-type semiconductor layer 127 may have a multiple layer structure, layers of which may have different compositions. The active layer 125 may have a multiple quantum well (MQW) structure in which a quantum well layer and a quantum barrier layer are alternately stacked. For example, the quantum well layer and the quantum barrier layer may be $In_xAl_yGa_{1-x-y}N$ ($0 \leq x \leq 1$, $0 \leq y \leq 1$, $0 \leq x+y \leq 1$) having different compositions. In an example embodiment, the quantum well layer may be $In_xGa_{1-x}N$ ($0 < x \leq 1$), and the quantum barrier layer may be GaN or AlGaN. A thickness of each of the quantum well layer and the quantum barrier layer may be within a range of about 1 nm to about 50 nm. The active layer 125 may not be limited to the multiple quantum well structure, and may also have a single quantum well structure.

The three-dimensionally structured semiconductor light emitting diode 100 may further include an insulating cap layer 132 disposed on the second surface 122B of the first conductivity-type semiconductor rod 122. A transparent electrode layer 135 may be on the insulating cap layer 132 and on the light emitting structure 120, e.g., on the second conductivity-type semiconductor layer 127, to be connected to the second conductivity-type semiconductor layer 127.

Referring to FIG. 1, the second surface 122B of the first conductivity-type semiconductor rod 122 may have a substantially planar upper surface, and the first surface 122A of the first conductivity-type semiconductor rod 122 may have a surface different from a crystal plane (e.g., a c surface) of the second surface 122B. In example embodiments, the first surface 122A of the first conductivity-type semiconductor rod 122 may be a cleavage plane obtained by cleaving the remaining etched portion 122E (see FIG. 5J). As illustrated in FIG. 1, the first surface 122A of the first conductivity-type semiconductor rod 122 may have an inclined surface, e.g., the first surface 122A may extend at an oblique angle with respect to the side surface 122C.

The insulating cap layer 132 may have an area greater than an area of the second surface 122B of the first conductivity-type semiconductor rod 122. The insulating cap layer 132 may have a portion extending further than the second surface 122B of the first conductivity-type semiconductor rod 122 along an entire circumference of the insulating cap layer 132. The insulating cap layer 132 may be configured as a mask pattern used in a process of forming the first conductivity-type semiconductor rod 122 (see FIG. 5B). For example, the insulating cap layer 132 may include oxide, nitride, or oxynitride. In example embodiments, the insulating cap layer 132 may include silicon nitride.

The insulating cap layer 132 may be provided such that the transparent electrode layer 135 may not be connected to the first conductivity-type semiconductor rod 122 and the active layer 125. In an example embodiment, the active layer 125 and the second conductivity-type semiconductor layer 127 may have ends, e.g., top surfaces (FIG. 1), adjacent to the second surface 122B of the first conductivity-type semiconductor rod 122. In this case, the insulating cap layer 132 may be disposed to, e.g., completely, cover the second surface 122B of the first conductivity-type semiconductor rod 122 and the end of the active layer 125. Further, to secure stable insulation, the insulating cap layer 132 may extend to cover a portion of the end of the second conductivity-type semiconductor layer 127.

The transparent electrode layer 135 may be disposed on the insulating cap layer 132, and may extend to a surface of the second conductivity-type semiconductor layer 127. In an example embodiment, the extended portion of the transparent electrode layer 135 may be disposed on an entire surface of the second conductivity-type semiconductor layer 127. However, an example embodiment thereof is not limited thereto, and the extended portion of the transparent electrode layer 135 may be formed on only a partial region of the surface of the second conductivity-type semiconductor layer 127.

The transparent electrode layer 135 may be a transparent electrode including, e.g., transparent conductive oxide or transparent conductive nitride, and may also include graphene. For example, the transparent electrode layer 135 may include at least one of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and $Zn_{(1-x)}Mg_xO$ (zinc magnesium oxide, $0 \leq x \leq 1$).

In an example embodiment, the three-dimensionally structured semiconductor light emitting diode 100 may include a passivation layer 140 disposed on the transparent electrode layer 135 to expose a portion of the transparent electrode layer 135 disposed on the insulating cap layer 132. The passivation layer 140 in the example embodiment may include a first insulating film 141 and a second insulating film 142.

As illustrated in FIG. 1, the first insulating film 141 may be disposed on the transparent electrode layer 135 to expose a contact region 135E of the transparent electrode layer 135 on the insulating cap layer 132, e.g., the first insulating film 141 may extend in parallel to and overlap the side surface 122C of the first conductivity-type semiconductor rod 122 without overlapping the second surface 122B of the first conductivity-type semiconductor rod 122. The second insulating film 142 may be disposed on the first insulating film 141 and may extend to cover the ends of the active layer 125 and the second conductivity-type semiconductor layer 127 adjacent to the first surface 122A. For example, as illustrated in FIG. 1, the second insulating film 142 may extend beyond the first insulating film 141 along ends of the active layer 125 and the second conductivity-type semiconductor layer 127, which face away from the second surface 122B, and along a side surface of the portion 122E toward the first surface 122A. The passivation layer 140 may include oxide, nitride, and oxynitride. For example, in the passivation layer 140, at least one of the first and second insulating films 141 and 142 may include $SiO_2$, SiN, SiON, or AlN.

The three-dimensionally structured semiconductor light emitting diode 100 may include a first connection electrode 210 connected to the first surface 122A of the first conductivity-type semiconductor rod 122, and a second connection electrode 220 connected to the contact region 135E of the transparent electrode layer 135. The first and second connection electrodes 210 and 220 may extend to a portion adjacent to the passivation layer 140. For example, the first connection electrode 210 may extend to a side surface of the portion 122E adjacent to the first surface 122A.

Referring to FIG. 1, the first and second connection electrodes 210 and 220 are illustrated by dotted lines. In a device level (see FIG. 1), the first and second connection electrodes 210 and 220 may not be actually provided, and may be provided as a bonding metal for being fastened to the electrode portions 310 and 320 in a set level (see FIG. 4). The first and second connection electrodes 210 and 220 may include, e.g., Ag, Ni, Al, Cr, Rh, Pd, Ir, Ru, Mg, Zn, Pt, or Au, or may include the above-described transparent conductive materials, e.g., ITO, IZO, and ITZO.

Figure 3:
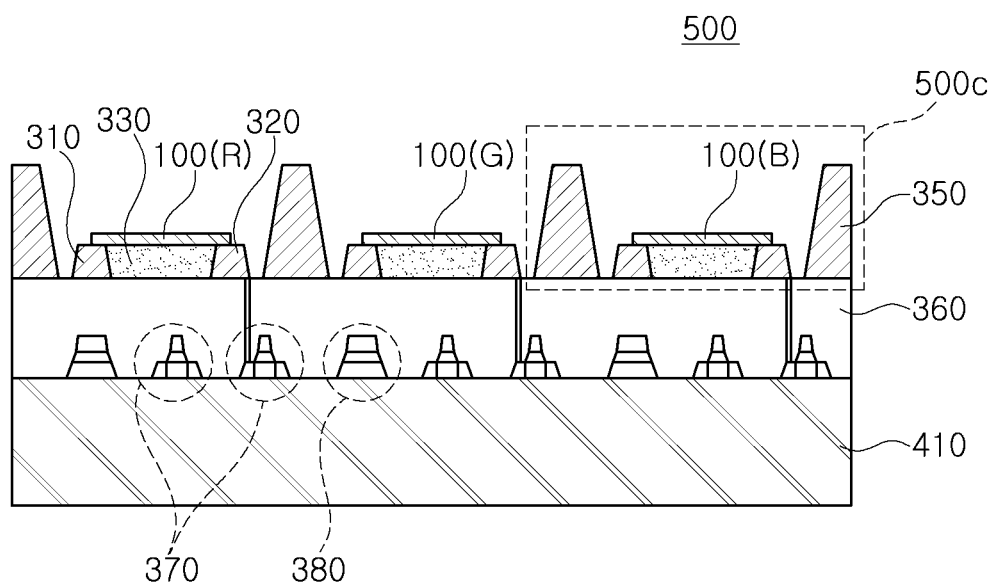
FIG. 3 is a lateral cross-sectional diagram illustrating a display device according to an example embodiment.
Figure 4:
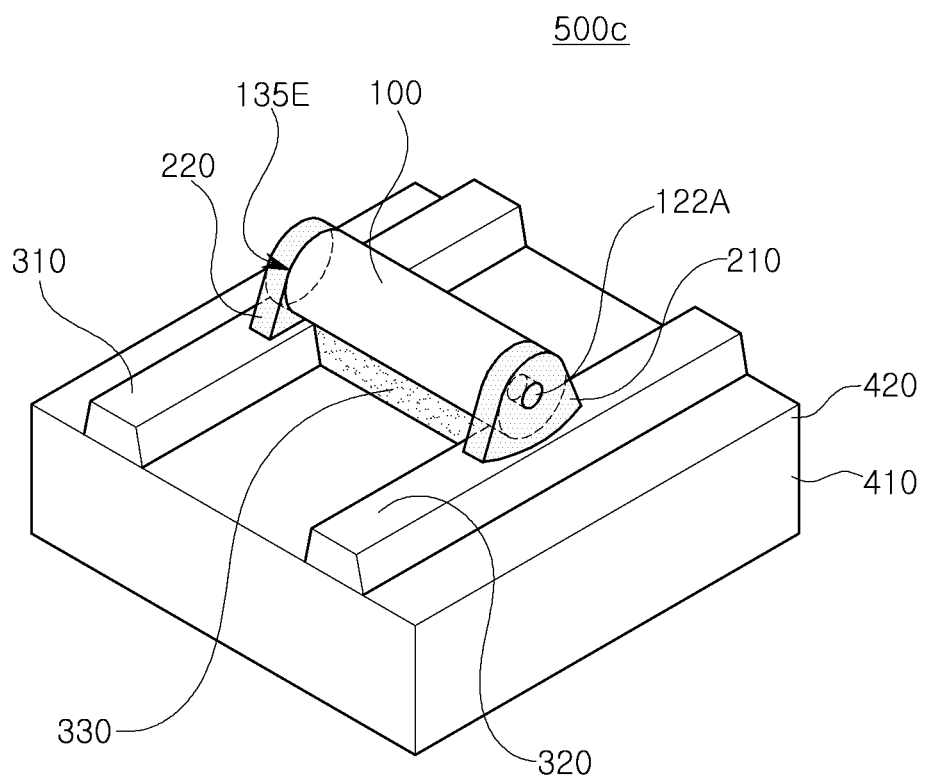
FIG. 4 is a perspective diagram illustrating an example of a pixel of the display device illustrated in FIG. 3.

By configuring each pixel using the three-dimensionally structured semiconductor light emitting diode illustrated in FIG. 1, a high-resolution display device may be implemented. FIG. 3 is a lateral cross-sectional diagram illustrating a display device according to an example embodiment. FIG. 4 is a perspective diagram illustrating an example of a pixel of the display device illustrated in FIG. 3.

Referring to FIG. 3, a display device 500 in the example embodiment may include three-dimensionally structured semiconductor light emitting diodes 100 disposed in pixel regions, respectively. The three-dimensionally structured semiconductor light emitting diodes 100 may be configured to emit red (R) light, green (G) light, and blue (B) light, respectively. Each pixel may be defined by a pixel barrier 350.

Each of the three-dimensionally structured semiconductor light emitting diodes 100 may have a predetermined length, e.g., sufficient length, such that the three-dimensionally structured semiconductor light emitting diodes 100 may be disposed, e.g., directly, on first and second electrode portions 310 and 320, respectively. In an example embodiment, the three-dimensionally structured semiconductor light emitting diodes 100 may be self-aligned between the first and second electrode portions 310 and 320 using electrical bias, and the aligned three-dimensionally structured semiconductor light emitting diodes 100 may be fastened by an insulating support body 330. Driving circuit devices, e.g., transistors 370 and capacitors 380, and an insulating film 360 covering the driving circuit devices may be disposed between a substrate 410 and the three-dimensionally structured semiconductor light emitting diodes 100.

FIG. 4 is a perspective diagram illustrating an example of a pixel 500c of the display device 500 in FIG. 3. In FIG. 4, the driving circuit devices (e.g., the transistors 370 and capacitors 380) and the insulating film 360 are omitted for ease of illustration and description.

Referring to FIG. 4, the three-dimensionally structured semiconductor light emitting diode 100 may be disposed between a first electrode portion 310 and a second electrode portion 320 in a length direction thereof. The first surface 122A (of the first conductivity-type semiconductor rod 122 in FIG. 1) and the contact region 135E (of the transparent electrode layer 135 in FIG. 1) may be connected to the first and second electrode portions 310 and 320 by first and second connection electrodes 210 and 220, respectively. The first and second connection electrodes 210 and 220 may include, e.g., Ag, Ni, Al, Cr, Rh, Pd, Ir, Ru, Mg, Zn, Pt, or Au or may include the above-described transparent material, e.g., ITO, IZO, ITZO, or the like.

FIGS. 5A to 5J are cross-sectional diagrams illustrating stages in a method of manufacturing the semiconductor light emitting diode 100 of FIG. 1.

Figure 5A:
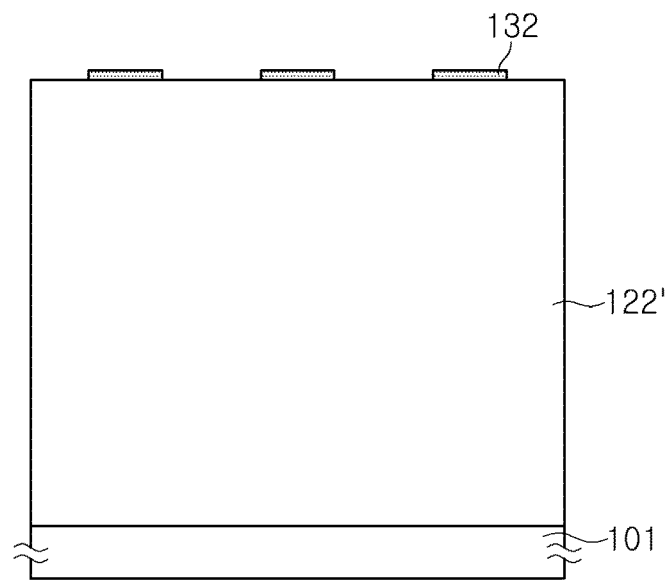
FIGS. 5A to 5J are cross-sectional diagrams illustrating stages in a method of manufacturing the three-dimensionally structured semiconductor light emitting diode illustrated in FIG. 1.

Referring to FIG. 5A, a first conductivity-type semiconductor layer 122' may be formed on a substrate 101, and a plurality of insulating cap layers 132, i.e., a mask pattern, may be formed on the substrate 101.

In an example embodiment, the substrate 101 may be of nitride single crystal growth, and the first conductivity-type semiconductor layer 122' may be an N-type nitride semiconductor layer, e.g., N-type GaN. For example, the substrate 101 may include at least one of an insulating, conductive, and semiconducting material, e.g., Si, SiC, $MgAl_2O_4$, MgO, $LiAlO_2$, $LiGaO_2$, GaN, or the like.

A buffer layer may be formed on the substrate 101 in advance, i.e., before the first conductivity-type semiconductor layer 122' is formed. The buffer layer may be provided to alleviate a lattice defect of the first conductivity-type semiconductor layer 122' grown on the substrate 101, and may include an undoped nitride semiconductor, e.g., undoped GaN, undoped AlN, or undoped InGaN.

The first conductivity-type semiconductor layer 122' may be grown by a metal organic chemical vapor deposition (MOCVD) process. After an insulating layer is formed on the first conductivity-type semiconductor layer 122', the plurality of insulating cap layers 132 for a rod structure (also referred to as "internal rod 122N") may be formed using a patterning process. For example, the plurality of insulating cap layers 132 may include silicon nitride or silicon oxynitride.

Figure 5B:
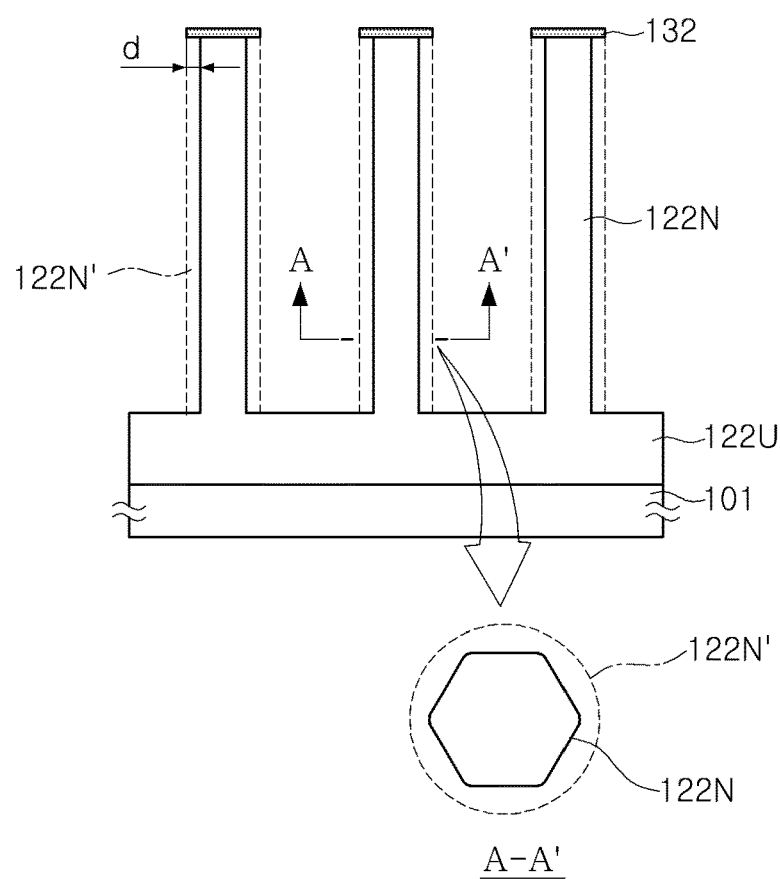

Referring to FIG. 5B, a plurality of the internal rods 122N may be formed using the plurality of insulating cap layers 132 as masks, respectively.

In this process, a primary rod structure 122N' (indicated by dashed lines in FIG. 5B) may be formed using an anisotropic etching process (e.g., a dry etching process), and a lower portion of the plurality of insulating cap layers 132 may be further etched using an isotropic etching process (a wet etching process), thereby forming the primary rod structure 122N'. Also, a first conductivity-type semiconductor base layer 122U, which has not been etched, may remain below the plurality of primary rod structures 122N' obtained in this process.

Figure 5C:
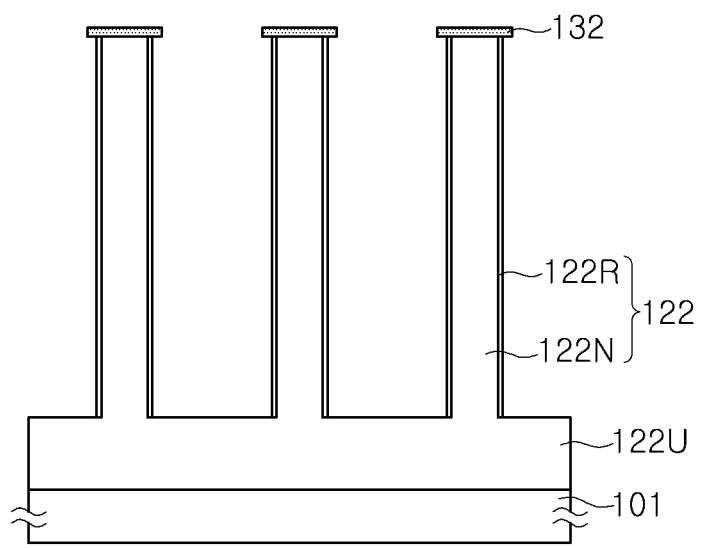
Figure 5D:
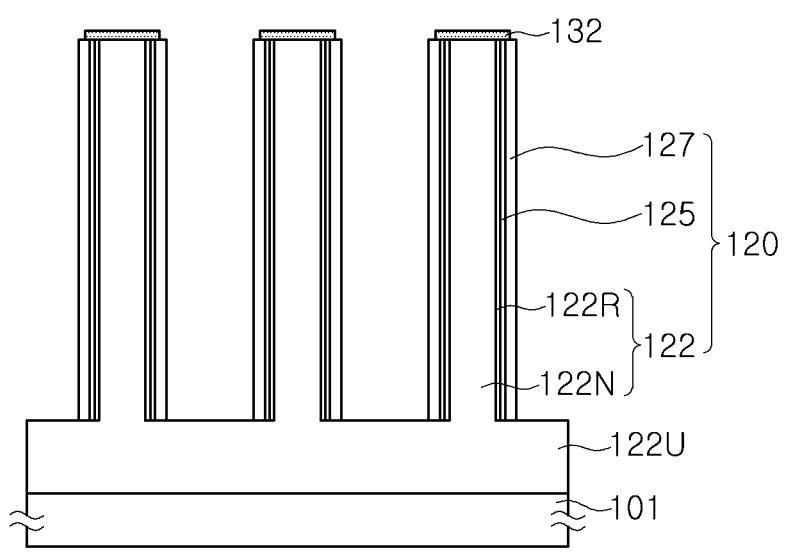

A length, e.g., thickness, d to be additionally etched in each of the primary rod structures 122N' may be configured to be greater than at least a thickness of the active layer 125 (in FIG. 5D). For example, as illustrated in FIG. 5B, a thickness d surrounding an entire side surface of each of the primary rod structures 122N' may be further removed, e.g., the portion between each solid line and a corresponding dashed line in FIG. 5B, to form the internal rod 122N with each of the insulating cap layers 132 overhanging a corresponding internal rod 122N. For example, adjusting the thickness d to be larger than that of the active layer 125 (to be formed subsequently on the internal rod 122N under the insulating cap layer 132 in FIG. 5D) ensures that the insulating cap layer 132 covers the entirety of the top surface (i.e., an end facing the insulating cap layer 132) of the active layer 125. In an example embodiment, the additionally etched thickness d may be configured to be within a range of about 10 nm to about 50 nm, greater than a thickness of the active layer 125 to be formed subsequently, such that an overall portion of the second conductivity-type semiconductor layer 127 (in FIG. 5D) may not be covered by the insulating cap layer 132.

As illustrated in the enlarged cross-sectional surface along line A-A', the primary rod structure 122N' may have a cross-sectional surface having a shape corresponding to that of a cross-sectional surface of the insulating cap layer 132, and by the additional etching process, the internal rod 122N may have a stable single crystal plane. For example, when nitride semiconductor single crystal is used, the internal rod 122N may have a hexagonal columnar structure. However, an example embodiment thereof is not limited thereto. In an example embodiment, the etching process may not be sufficiently performed such that a cross-sectional surface of the internal rod 122N may have a rounded shape, such as a hexagonal shape without angular portions.

Referring to FIG. 5C, the first conductivity-type semiconductor rod 122 may be formed by forming the regrowth layer 122R on each of side surfaces of the plurality of internal rods 122N.

The regrowth layer 122R may be regrown on the side surfaces of the plurality of internal rods 122N through the MOCVD process using the same first conductivity-type semiconductor. The side surfaces damaged by the process of etching the plurality of internal rods 122N may have a crystal plane (e.g., a non-polar plane) having improved quality by the regrowth layer 122R. In an example embodiment, even when a cross-sectional surface of the internal rod 122N has a rounded shape, rather than a hexagonal shape, the first conductivity-type semiconductor rod 122 may have a hexagonal columnar structure having a hexagonal cross-sectional surface.

Referring to FIG. 5D, the active layer 125 and the second conductivity-type semiconductor layer 127 may be sequentially formed on side surfaces of the plurality of first conductivity-type semiconductor rods 122, e.g., on the regrowth layer 122R, to be disposed below each of the plurality of insulating cap layers 132.

For example, the active layer 125 and the second conductivity-type semiconductor layer 127 may be sequentially deposited on the side surfaces of the plurality of first conductivity-type semiconductor rods 122 using the MOCVD process. By this process, a light emitting structure 120 having a core-shell structure may be formed. In an example embodiment, the active layer 125 may have a multiple quantum well structure, e.g., InGaN/GaN, and the second conductivity-type semiconductor layer 127 may be a P-type nitride semiconductor layer. For example, the second conductivity-type semiconductor layer 127 may have a multiple layer structure including p-GaN/p-AlGaN. As discussed previously, the active layer 125 may be formed between each of the first conductivity-type semiconductor rods 122 and a corresponding second conductivity-type semiconductor layer 127, such each of the insulating cap layers 132 overhangs a corresponding first conductivity-type semiconductor rod 122 and a corresponding active layer 125. For example, as illustrated in FIG. 5D, a portion of an upper surface (i.e., a surface facing the insulating cap layer 132) of the second conductivity-type semiconductor layer 127 may be exposed by the insulating cap layer 132.

Figure 5E:
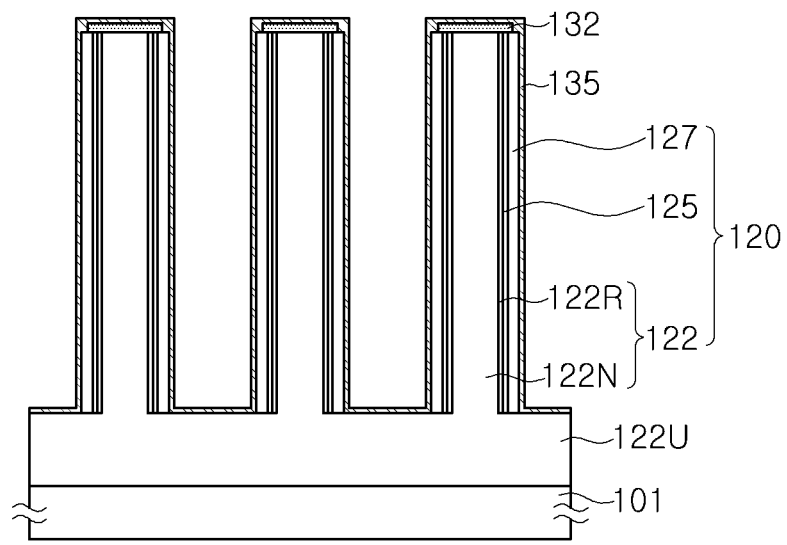

Thereafter, referring to FIG. 5E, the transparent electrode layer 135 may be formed on an upper surface of each of the plurality of insulating cap layers 132 and on an exposed surface, e.g., upper and side surfaces, of the second conductivity-type semiconductor layer 127. The insulating cap layer 132 on each of the first conductivity-type semiconductor rods 122, e.g., completely, separates the transparent electrode layer 135 from a corresponding first conductivity-type semiconductor rods 122 and a corresponding active layer 125.

In this process, as the transparent electrode layer 135 is deposited on an overall surface, e.g., on an overall exposed surface of the structure in FIG. 5D, the transparent electrode layer 135 may be deposited on the first conductivity-type semiconductor base layer 122U in addition to the upper surface of each of the plurality of insulating cap layers 132 and an exposed surface of the second conductivity-type semiconductor layer 127. The transparent electrode layer 135 formed in this process, e.g., via MOCVD, may be electrically insulated from the first conductivity-type semiconductor rod 122 and the active layer 125 by the insulating cap layer 132.

In an example embodiment, the transparent electrode layer 135 may be configured as a transparent electrode formed of, e.g., a transparent conductive oxide or a transparent conductive nitride, or may include graphene. For example, the transparent electrode layer 135 may be configured as at least one of ITO, ZITO, ZIO, GIO, ZTO, FTO, AZO, GZO, $In_4Sn_3O_{12}$, and $Zn(1-x)Mg_xO(0 \le x \le 1)$.

Figure 5F:
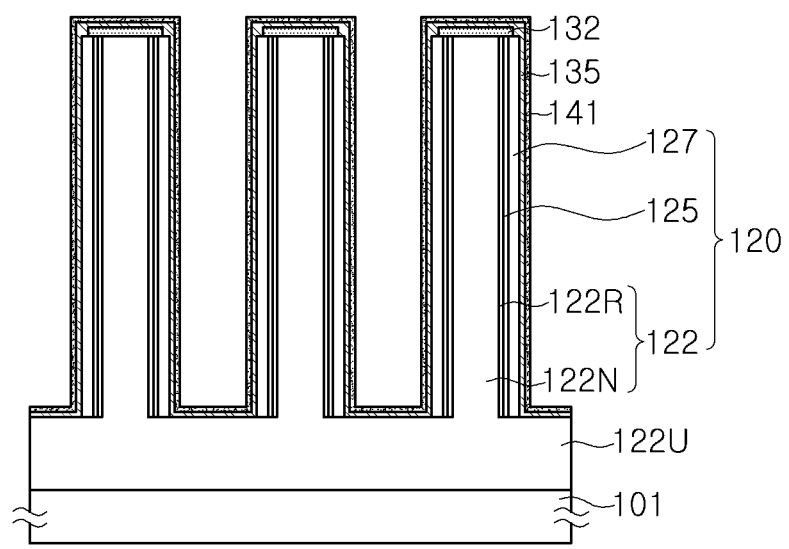

Referring to FIG. 5F, the first insulating film 141 may be formed to cover the transparent electrode layer 135.

In detail, similarly to the process of forming the transparent electrode layer 135 described above, the first insulating film 141 may be formed. The first insulating film 141 may be provided as a passivation layer, and may protect the transparent electrode layer 135 from damages caused by a subsequent etching process. In the case in which damage of the transparent electrode layer 135 disposed on a side surface of the light emitting structure 120 is prevented in a subsequent etching process by other processes, the above-described process may not be performed (see FIG. 8).

Figure 5G:
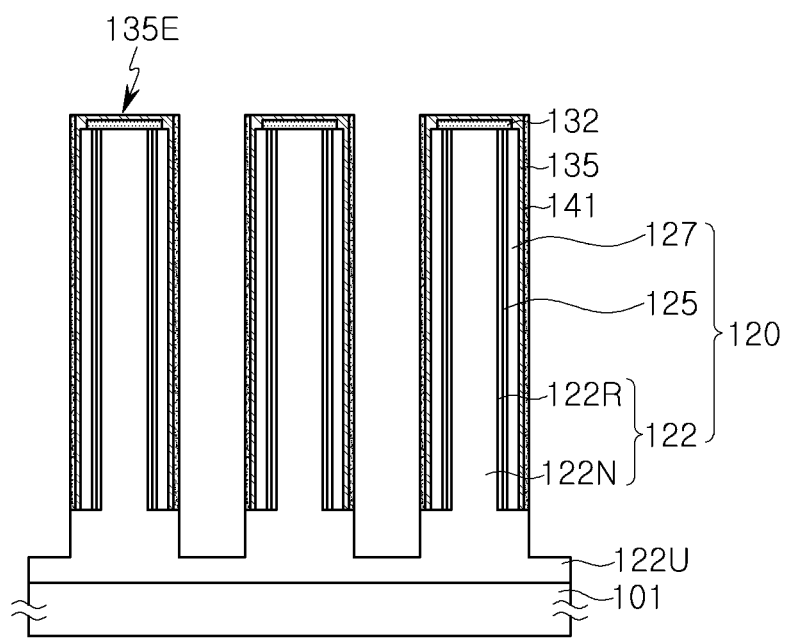

Thereafter, referring to FIG. 5G, the first conductivity-type semiconductor base layer 122U disposed between the plurality of first conductivity-type semiconductor rods 122 may be etched to easily separate adjacent ones of the light emitting structures 120. An anisotropic etching process (e.g., a dry etching process) may be applied to remove the first insulating film 141 and the transparent electrode layer 135 disposed between the plurality of three-dimensional semiconductor light emitting structures 120.

In detail, first in this process, the first insulating film 141 having a relatively thin thickness and the transparent electrode layer 135 are completely removed between adjacent ones of the plurality of three-dimensional semiconductor light emitting structures 120. Further, during the same process, the first insulating film 141 may be removed from an upper portion of the insulating cap layer 132 to expose the contact region 135E of the transparent electrode layer 135. Thereafter, the first conductivity-type semiconductor base layer 122U disposed between the plurality of three-dimensional semiconductor light emitting structures 120 may be primarily etched using an anisotropic etching process (e.g., a dry wet etching process).

Figure 5H:
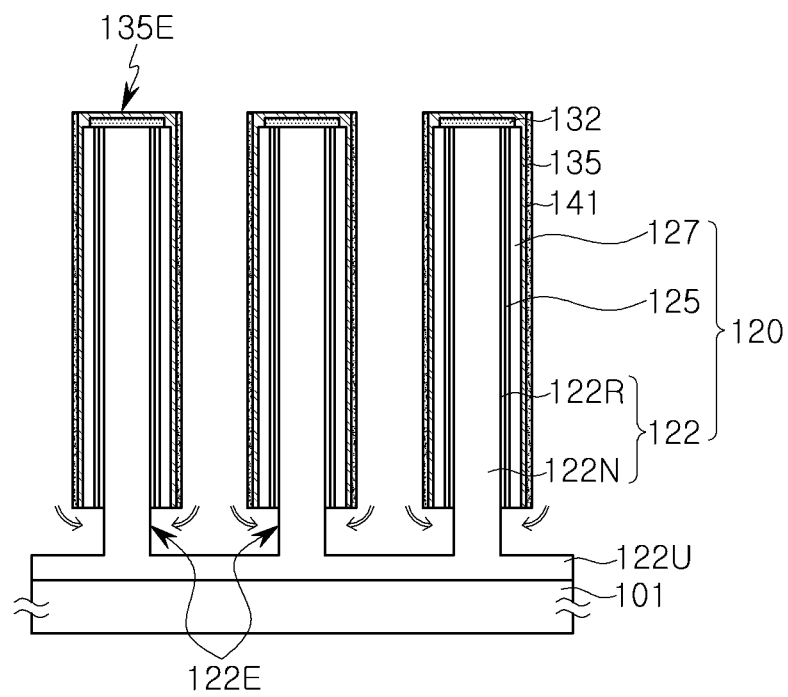

Referring to FIG. 5H, the portion 122E of the light emitting structure 120 may be formed by combining an anisotropic etching process and an isotropic etching process, and the light emitting structure 120 may be separated using the narrow lower region.

In detail, the portion 122E, i.e., a narrow lower region 122E, may be formed below the plurality of three-dimensional semiconductor light emitting structures 120 by further etching the primarily etched portion using an isotropic etching process. As the portion 122E is formed of a first conductivity-type semiconductor connected to the first conductivity-type semiconductor rod 122, a portion integrated with the first conductivity-type semiconductor rod 122 may be formed. However, the portion 122E may have a cross-sectional shape different from that of the first conductivity-type semiconductor rod 122. Also, the portion 122E may have a width smaller than a width of the first conductivity-type semiconductor rod 122, as discussed previously with reference to FIGS. 2A and 2B, to be stably separated.

Figure 5I:
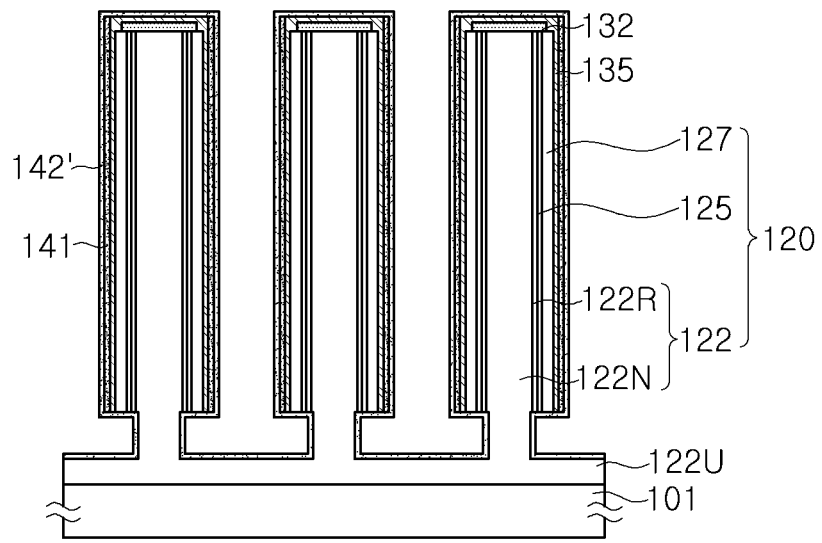

Referring to FIG. 5I, the second insulating film 142 may be formed on a surface of the first insulating film 141 and a surface of the etched portion below the plurality of three-dimensional semiconductor light emitting structures 120.

The second insulating film 142 may be provided as a passivation layer. The second insulating film 142 may be disposed on the first insulating film 141, and may be formed to cover lower ends of the active layer 125 and the second conductivity-type semiconductor layer 127. When a connection electrode connected to the first conductivity-type semiconductor rod 122 is formed, the second insulating film 142 may prevent unnecessary connection with the transparent electrode layer 135 and also with the second conductivity-type semiconductor layer 127 and the active layer 125. For example, the second insulating film 142 may include oxide, nitride, or oxynitride, similarly to the first insulating film 141.

Figure 5J:
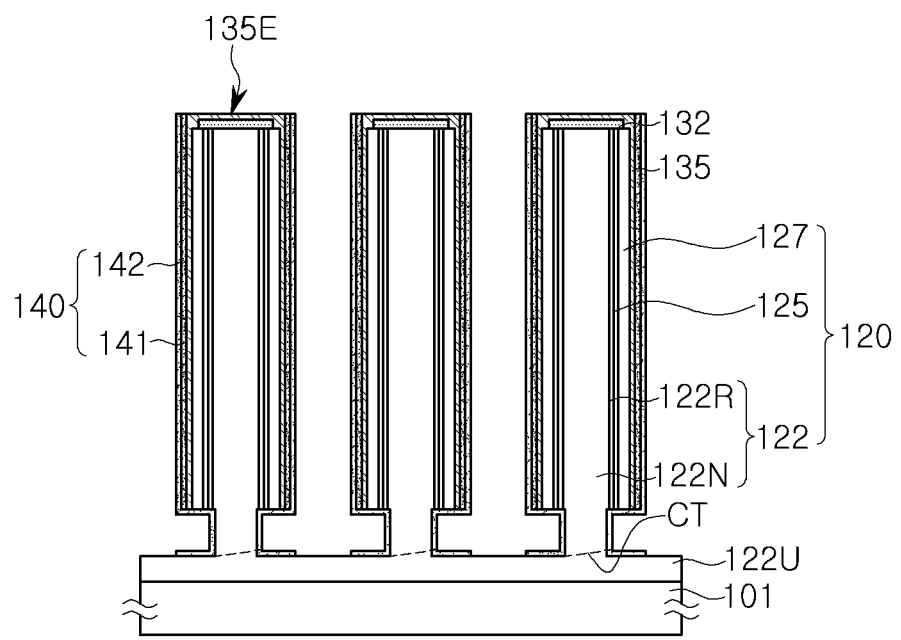

Referring to FIG. 5J, an etching process may be applied to the second insulating film 142 to expose a portion of the transparent electrode layer 135 disposed on the insulating cap layer 132. The etching process may be an anisotropic etching process similar to the etching process applied to the first insulating film 141, and the contact region 135E of the transparent electrode layer 135 may be open, e.g., exposed, again.

Thereafter, the plurality of three-dimensional semiconductor light emitting structures 120 may be separated from the first conductivity-type semiconductor base layer 122U by cutting out the portion 122E of the plurality of three-dimensional semiconductor light emitting structures 120. For example, the portion 122E may be cut out, e.g., separated from the first conductivity-type semiconductor base layer 122U, along a surface CT (i.e., the inclined dashed line in FIG. 5J). The surface CT may be vulnerable to stress, e.g., due to narrow width, and the surface formed by the cutting out (i.e., the first surface 122A in FIG. 1) may be a cleavage plane obtained along a crystal plane, or an non-planar surface. The stress, e.g., catting, may be provided by a relatively light-weighted thermal or mechanical impact.

Figure 6:
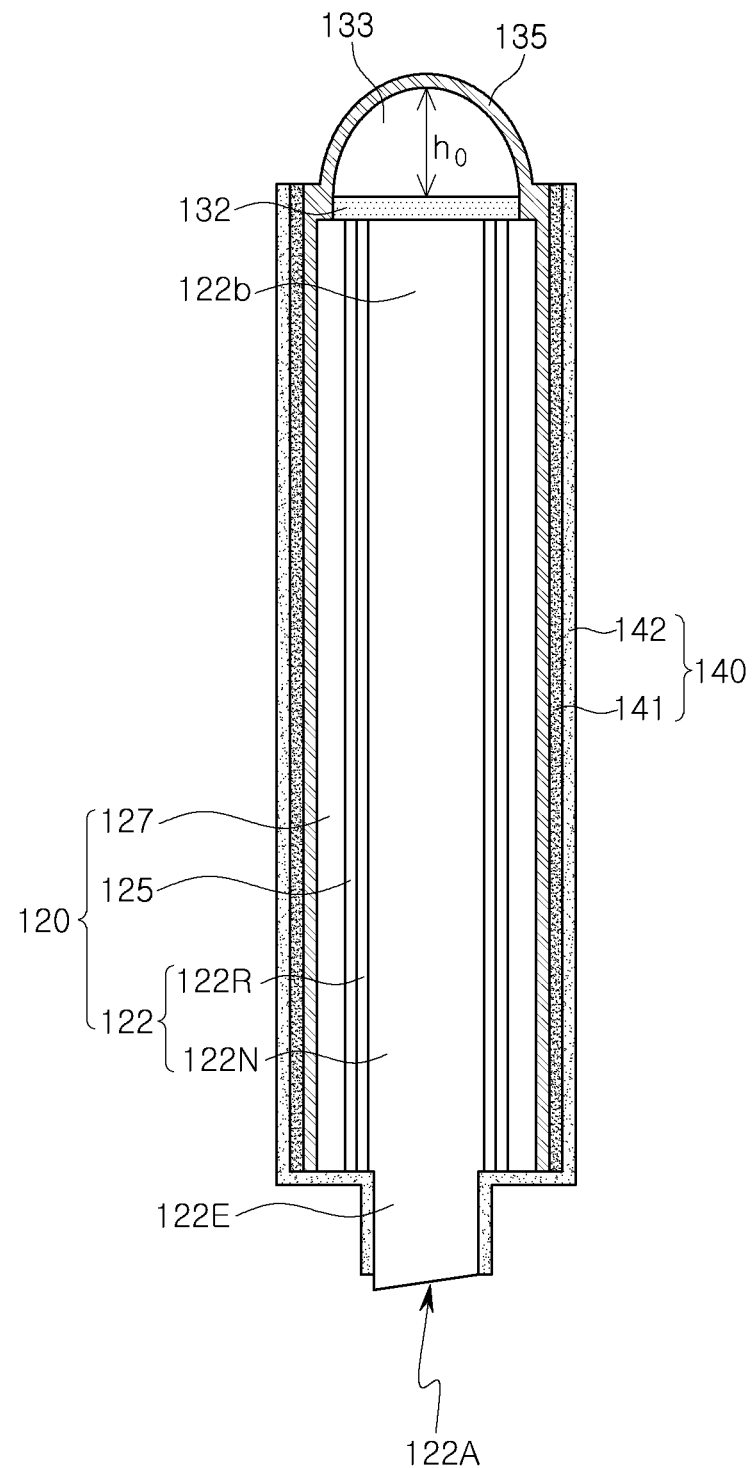
FIG. 6 is a lateral cross-sectional diagram illustrating a three-dimensionally structured semiconductor light emitting diode according to an example embodiment.

FIG. 6 is a lateral cross-sectional diagram illustrating a three-dimensionally structured semiconductor light emitting diode according to an example embodiment.

Referring to FIG. 6, a three-dimensionally structured semiconductor light emitting diode 100A may be similar to the three-dimensionally structured semiconductor light emitting diode 100 illustrated in FIGS. 1 to 2B, with the exception of having a dome-shaped insulating portion 133 on the insulating cap layer 132. Therefore, the descriptions of the elements of the example embodiment may be the same as or similar to the descriptions of the elements of the three-dimensionally structured semiconductor light emitting diode 100 illustrated in FIGS. 1 to 2B unless otherwise indicated.

As illustrated in FIG. 6, the dome-shaped insulating portion 133 may be, e.g., directly, on the insulating cap layer 132. The insulating cap layer 132 and the dome-shaped insulating portion 133 may be mask elements used for the etching process for the rod structure illustrated in FIGS. 5A and 5B. The dome-shaped insulating portion 133 may be a structure obtained by performing a subsequent process (FIGS. 5C to 5F) without removing a hard mask material remaining on the insulating cap layer 132 after the pattern forming process (in FIG. 5A) and the rod structure forming process (in FIG. 5B). Accordingly, the transparent electrode layer 135 may be formed along a curved surface of the insulating cap layer 132.

The insulating cap layer 132 and the dome-shaped insulating portion 133 may include different insulating materials. For example, the insulating cap layer 132 may include nitride or oxynitride, while the dome-shaped insulating portion 133 may include an oxide, e.g., a spin-on hardmask (SOH).

Figure 7A:
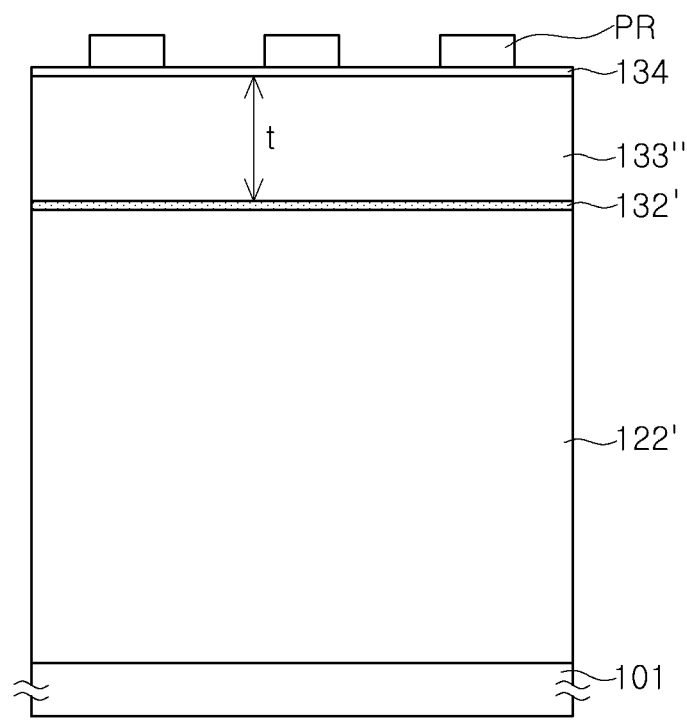
FIGS. 7A to 7C are cross-sectional diagrams illustrating stages in a method of manufacturing the three-dimensionally structured semiconductor light emitting diode illustrated in FIG. 6.
Figure 7B:
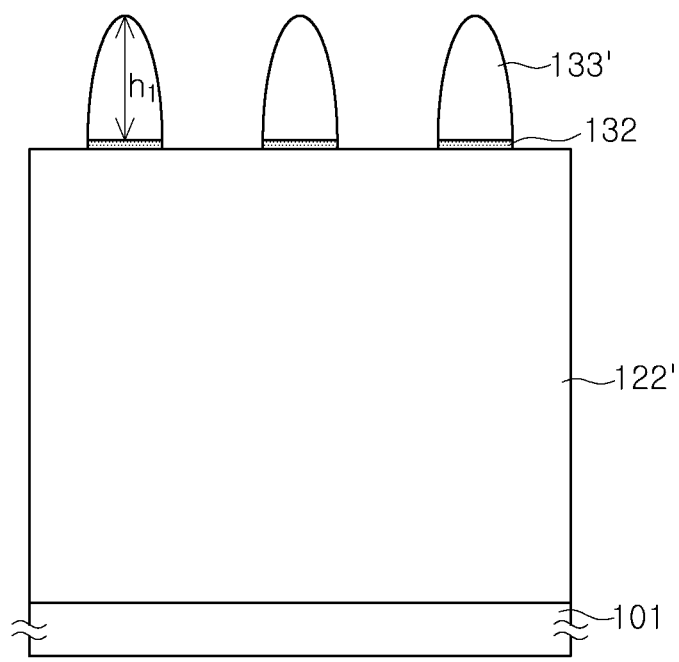
Figure 7C:
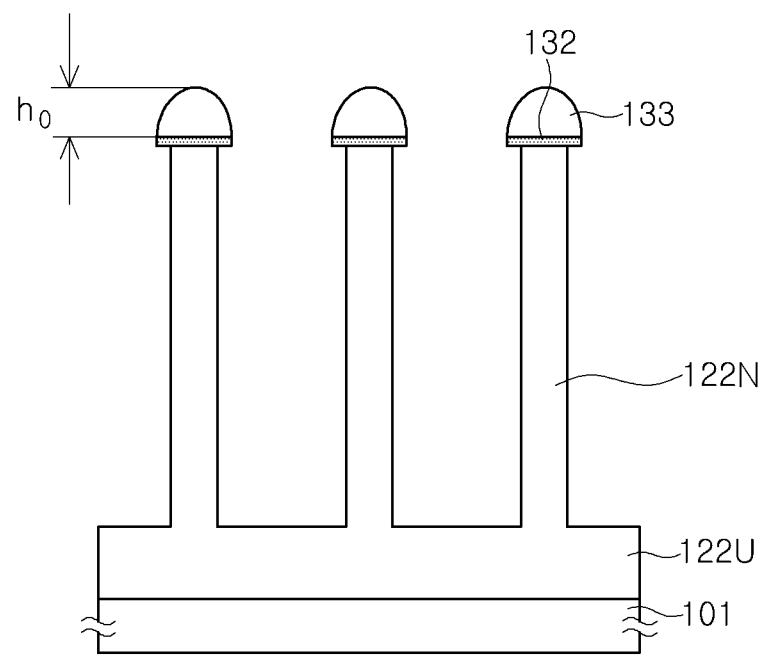

FIGS. 7A to 7C are cross-sectional diagrams illustrating stages in a method of manufacturing the three-dimensionally structured semiconductor light emitting diode 100A.

Referring to FIG. 7A, a mask layer 132', a hard mask layer 133", and a reflection prevention film 134 may be sequentially formed on the first conductivity-type semiconductor layer 122' (an object to be etched). A photoresist layer may be formed on the reflection prevention film 134, and a photoresist pattern PR may be formed using a lithography process.

The reflection prevention film 134 may prevent diffuse reflection of light used for the lithography process forming the photoresist pattern PR. For example, the reflection prevention film 134 may include titanium, titanium dioxide, titanium nitride, chrome oxide, carbon, silicon nitride, silicon oxynitride, or amorphous silicon. The hard mask layer 133" may be formed to a thickness t.

Referring to FIG. 7B, the insulating cap layer 132 (i.e., a nitride cap layer) may be formed on the first conductivity-type semiconductor layer 122', and a hard mask pattern 133' having a dome structure may be formed on the insulating cap layer 132. Thereafter, referring to FIG. 7C, the internal rod 122N may be formed by etching the first conductivity-type semiconductor layer 122' using the insulating cap layer 132 and the hard mask pattern 133' having a dome structure disposed on the insulating cap layer 132. The hard mask pattern 133' having a dome structure may have a height h1 smaller than the thickness t of the hard mask layer 133".

In this process, similarly to the process described in FIG. 5B, the internal rod 122N may be formed by further etching a lower portion of the plurality of insulating cap layers 132 by combining an anisotropic etching process (e.g., a dry etching process) and an isotropic etching process (a wet etching process). In this etching process, the hard mask pattern 133' having a dome structure may also be etched such that the dome-shaped insulating portion 133 having a height h0 smaller than the height h1 of the hard mask pattern 133' having a dome structure may be formed.

As described above, by performing subsequent processes (processes of FIGS. 5C to 5J) without removing the dome-shaped insulating portion 133 on the insulating cap layer 132, the three-dimensionally structured semiconductor light emitting diode 100A illustrated in FIG. 6 may be manufactured. Differently from the above-described example embodiment, in another example embodiment, a subsequent process may be performed after the dome-shaped insulating portion 133 is removed from the insulating cap layer 132, and in this case, the three-dimensionally structured semiconductor light emitting diode 100 illustrated in FIG. 1 may be manufactured.

Figure 8:
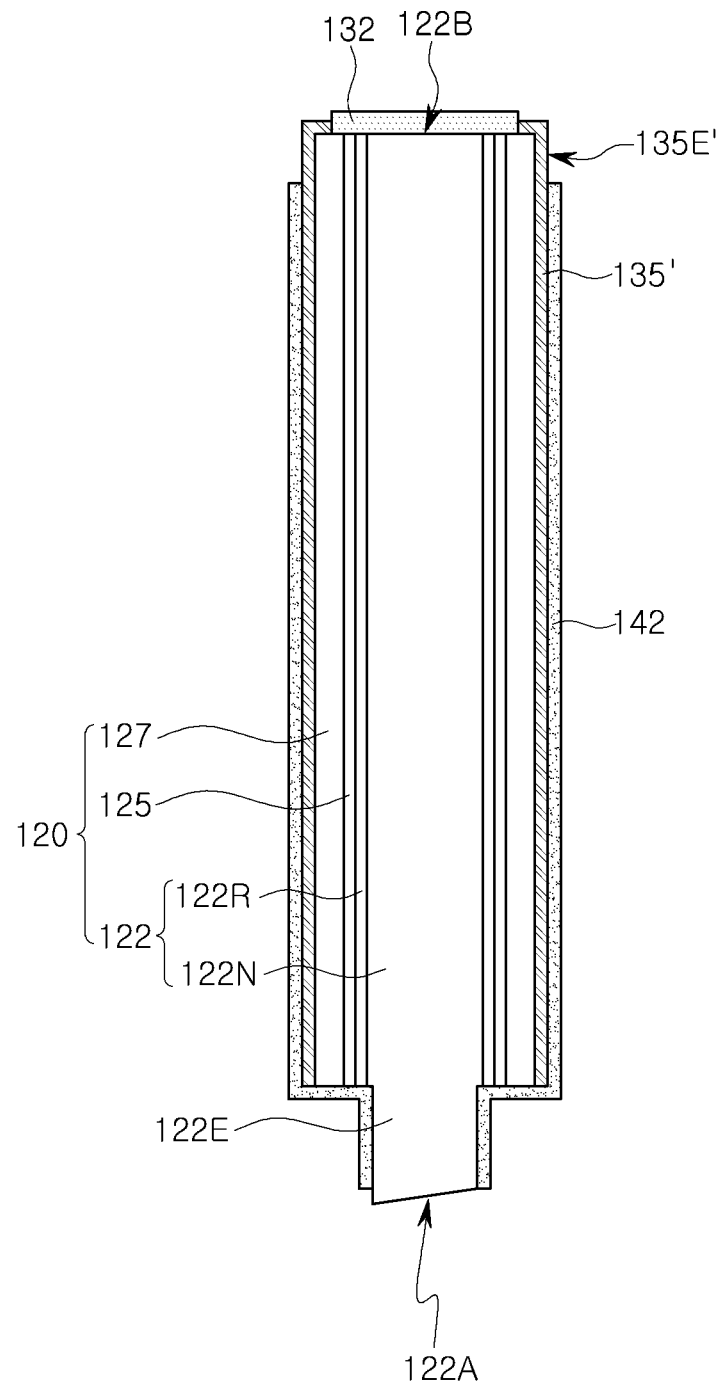
FIGS. 8 and 9 are lateral cross-sectional diagrams illustrating a three-dimensionally structured semiconductor light emitting diode according to one or more example embodiments.
Figure 9:
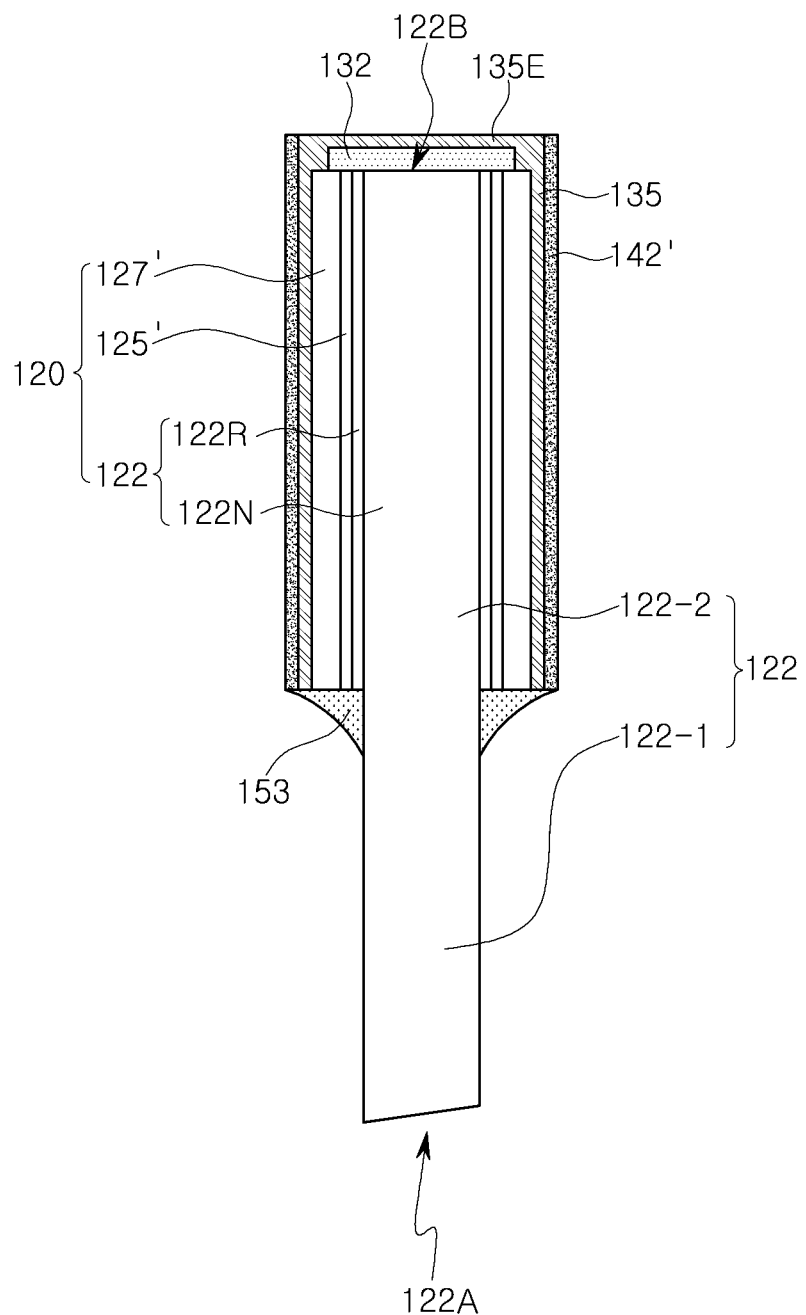

FIGS. 8 and 9 are lateral cross-sectional diagrams illustrating three-dimensionally structured semiconductor light emitting diodes according to one or more example embodiments.

Referring to FIG. 8, a three-dimensionally structured semiconductor light emitting diode 100B in the example embodiment may be similar to the three-dimensionally structured semiconductor light emitting diode 100, with the exception of including a single passivation layer (rather than two passivation films). That is, the three-dimensionally structured semiconductor light emitting diode 100B may include the second insulating film 142 without the first insulating film 141. As such, a transparent electrode layer 135' may not be disposed on the insulating cap layer 132, and a side surface region 135E' (i.e., a contact region) of the transparent electrode layer 135' adjacent to the second surface 122B may be opened, i.e., exposed. The descriptions of the elements of the example embodiment may be the same as or similar to the descriptions of the elements of the three-dimensionally structured semiconductor light emitting diode 100 illustrated in FIGS. 1 to 2B unless otherwise indicated.

As illustrated in FIG. 8, in the example embodiment, the second insulating film 142 may be the film formed in the processes illustrated in FIGS. 5I and 5J. Differently from the aforementioned example embodiment, by reducing an effect applied to the transparent electrode layer 135 by adjusting conditions of the etching processes (in FIGS. 5G and 5H) for forming the portion 122E having a narrow width, the first insulating film 141 for protecting the transparent electrode layer 135 disposed on a side surface of the light emitting structure may not be provided.

The second insulating film 142 may extend to cover the ends of the active layer 125 and the second conductivity-type semiconductor layer 127 adjacent to the first surface 122A. The second insulating film 142 may prevent a first connection electrode (element 210 in FIG. 1) to be connected to the first surface 122A of the first conductivity-type semiconductor rod 122 from being unnecessarily connected to the active layer 125 and the second conductivity-type semiconductor layer 127.

The transparent electrode layer 135' in the example embodiment may not remain on the insulating cap layer 132. For example, the transparent electrode layer 135' disposed on the insulating cap layer 132 may also be removed in the etching process illustrated in FIG. 5G, and accordingly, the insulating cap layer 132 disposed on the second surface 122B may be open, e.g., exposed. In an example embodiment, the transparent electrode layer 135' may partially remain on the insulating cap layer 132 according to the etching process.

In an example embodiment, the second insulating film 142 may be formed to expose the side surface region 135E' adjacent to the second surface 122B. As the side surface region 135E' of the transparent electrode layer 135' is exposed, a contact area with a second connection electrode (element 220 in FIG. 1) may be sufficiently secured, thereby reducing contact resistance.

The above-described configurations in the example embodiment may be selectively combined with another example embodiment. For example, the passivation layer 140 of the three-dimensionally structured semiconductor light emitting diode illustrated in FIG. 1 may also be configured to be exposed to the contact region 135E of the transparent electrode layer 135 and also to the side surface region 135E' adjacent to the contact region 135E. In another example embodiment, in the three-dimensionally structured semiconductor light emitting diode illustrated in FIG. 1, the contact region 135E of the transparent electrode layer 135 disposed on the insulating cap layer 132 may partially remain or may not remain. In this case, the second connection electrode (element 220 in FIG. 1) may be connected to a portion of the transparent electrode layer 135 which partially remains and/or an upper end of the transparent electrode layer 135.

Referring to FIG. 9, a three-dimensionally structured semiconductor light emitting diode 100C in the example embodiment may be similar to the three-dimensionally structured semiconductor light emitting diode 100 illustrated in FIGS. 1 to 2B, with the exception of including an active layer 125' and a second conductivity-type semiconductor layer 127' only on an upper region (a second portion 122_2) of the first conductivity-type semiconductor rod 122, and a lower region (a first portion 122_1) of the first conductivity-type semiconductor rod 122 may be exposed by a sufficient length. The descriptions of the elements of the example embodiment may be the same as or similar to the descriptions of the elements of the three-dimensionally structured semiconductor light emitting diode 100 illustrated in FIGS. 1 to 2B unless otherwise indicated.

As illustrated in FIG. 9, the first conductivity-type semiconductor rod 122 in the example embodiment may be divided into the first portion 122_1 adjacent to the first surface 122A and the second portion 122_2 adjacent to the second surface 122B. The active layer 125' and the second conductivity-type semiconductor layer 127' may be sequentially disposed on a side surface of the second portion 122_2 of the first conductivity-type semiconductor rod 122. In an example embodiment, the first portion 122_1 may function similarly to the portion 122E adjacent to the first surface described in the aforementioned example embodiments, but while the portion 122E may be obtained by a subsequent etching process (see FIGS. 5G and 5H), the first portion 122_1 may be a lower region 122N_1 of the internal rod 122N in which the regrowth layer 122R is not formed.

By sufficiently securing a length of the first portion 122_1, a contact area with the first connection electrode (element 210 in FIG. 1) may be sufficiently secured. A length of the first portion 122_1 may be equal to or greater than 1 μm. For example, a length of the first portion 122_1 may be within a range of about 20% to about 50% of a total length of the first conductivity-type semiconductor rod 122. In an example embodiment, the length may be within a range of about 1 μm to about 2 μm.

A second insulating film 142' may be disposed on the transparent electrode layer 135 to expose a portion of the transparent electrode layer 135 disposed on the insulating cap layer 132. In an example embodiment, an insulating portion 153 may be configured as an additional passivation layer, and may be disposed to cover ends of the active layer 125' and the second conductivity-type semiconductor layer 127' adjacent to the first surface 122A. The first connection electrode may be connected to the first surface 122A of the first conductivity-type semiconductor rod 122, and a partial region of a side surface of the first portion 122_1 adjacent to the first surface 122A may extend. In an example embodiment, as a length of the first portion 122_1 may be sufficiently secured, it may be unlikely that the first connection electrode is unnecessarily connected to ends of the active layer 125' and the second conductivity-type semiconductor layer 127' adjacent to the first surface 122A, and thus, the insulating portion 153 may not be provided.

FIGS. 10A to 10D are cross-sectional diagrams illustrating stages in a method of manufacturing the three-dimensionally structured semiconductor light emitting diode 100C.

Figure 10A:
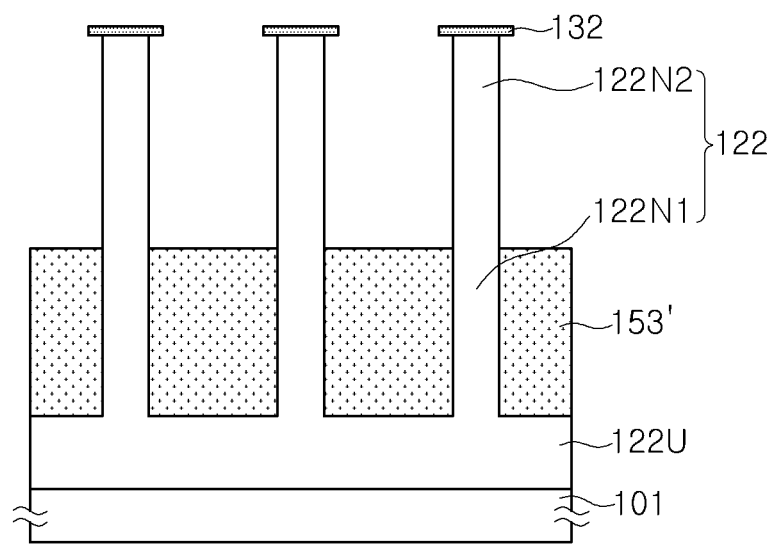
FIGS. 10A to 10D are cross-sectional diagrams illustrating stages in a method of manufacturing the three-dimensionally structured semiconductor light emitting diode illustrated in FIG. 9.

Referring to FIG. 10A, an insulating layer 153' may be formed on the first conductivity-type semiconductor base layer 122U to cover a lower region 122N_1 of an etched internal rod 122N.

The etched internal rod 122N may be the same as or similar to the internal rod 122N obtained in the process illustrated in FIG. 5B. In other words, the internal rod 122N may be obtained by an isotropic etching process (e.g., a wet etching process) to additionally etch a lower portion of the plurality of insulating cap layers 132, in addition to an anisotropic etching process (e.g., a dry etching process) using the plurality of insulating cap layers 132.

In this process, the insulating layer 153' may be formed to cover the etched internal rod 122N and the insulating cap layer 132, and an upper region 122N_2 of the internal rod 122N may be exposed through an etch back process. The insulating layer 153' may include an insulating material having an etch selectivity different from that of the insulating cap layer 132. For example, the insulating layer 153' may be silicon oxide, and the insulating cap layer 132 may be silicon nitride.

Figure 10B:
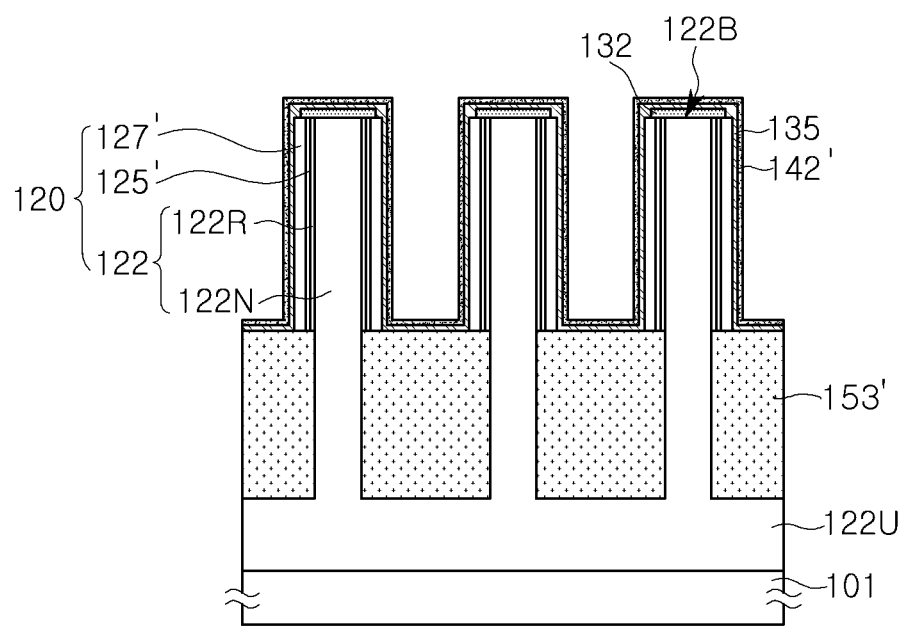

Referring to FIG. 10B, the light emitting structure 120 may be formed using the upper region 122N_2 of the internal rod 122N, and the transparent electrode layer 135 and the second insulating film 142' may be sequentially formed on a surface of the light emitting structure 120.

This process may be performed through a process similar to a partial process (the processes of FIGS. 5C to 5F) of the manufacturing process described in the aforementioned example embodiment, but this process may be limited to the upper region 122N_2 of the internal rod 122N.

The first conductivity-type semiconductor rod 122 may be formed by forming the regrowth layer 122R on a surface of the upper region 122N_2 of the internal rod 122N (see the process illustrated in FIG. 5C), and the active layer 125' and the second conductivity-type semiconductor layer 127' may be sequentially formed on side surfaces of the first conductivity-type semiconductor rod 122, thereby forming the light emitting structure 120 (see the process illustrated FIG. 5D). Thus, the region of the light emitting structure 120 which actually emit light may be limited to the upper region.

Thereafter, the transparent electrode layer 135 may be formed on an upper surface of the insulating cap layer 132 and a surface of the second conductivity-type semiconductor layer 127' (see the process illustrated in FIG. 5E), and the second insulating film 142' may be formed to cover the transparent electrode layer 135 (see the process illustrated in FIG. 5F).

Figure 10C:
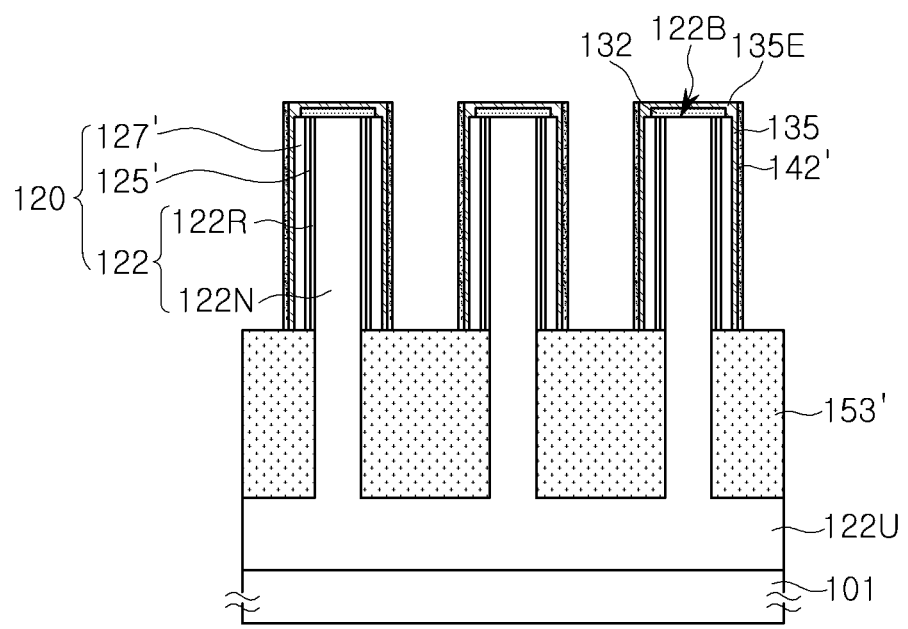

Referring to FIG. 10C, the transparent electrode layer 135 and the second insulating film 142' may be partially removed using an anisotropic etching process.

The portions of the transparent electrode layer 135 and the second insulating film 142' removed in the anisotropic etching process may be the portions disposed on an upper surface of the light emitting structure 120 and the portions disposed between the light emitting structures 120. The transparent electrode layer 135 disposed on the insulating cap layer 132 may be exposed through this process.

Figure 10D:
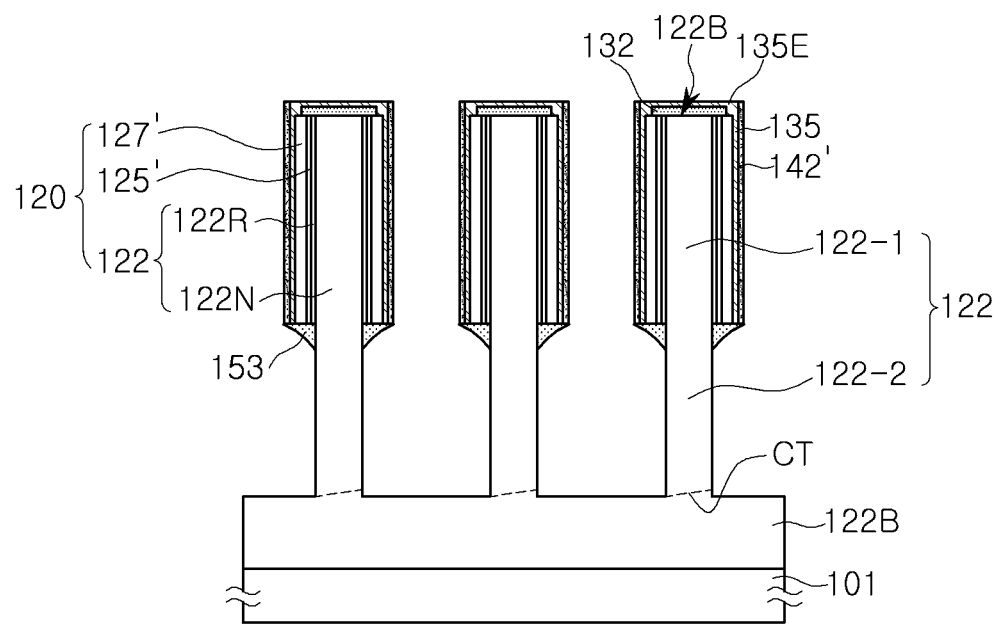

Referring to FIG. 10D, the insulating layer 153' surrounding the lower region 122N_1 of the internal rod 122N may be selectively removed.

The lower region 122N_1 of the internal rod 122N may be "a second portion" in view of the first conductivity-type semiconductor rod 122. The second portion 122_2 of the first conductivity-type semiconductor rod 122 may be exposed by removing the insulating layer 153'. Even after this process, the insulating layer 153' may include an insulating material having an etch selectivity, different from a material of the second insulating film 142', such that the second insulating film 142' may remain. For example, the insulating layer 153' may be silicon oxide, and the second insulating film 142' may be silicon nitride.

In an example embodiment, the insulating layer 153' may not be completely removed, and the insulating portion 153 may remain. The remaining insulating portion 153 may cover ends of the active layer 125 and the second conductivity-type semiconductor layer 127 adjacent to the first portion 122_1.

Figure 11:
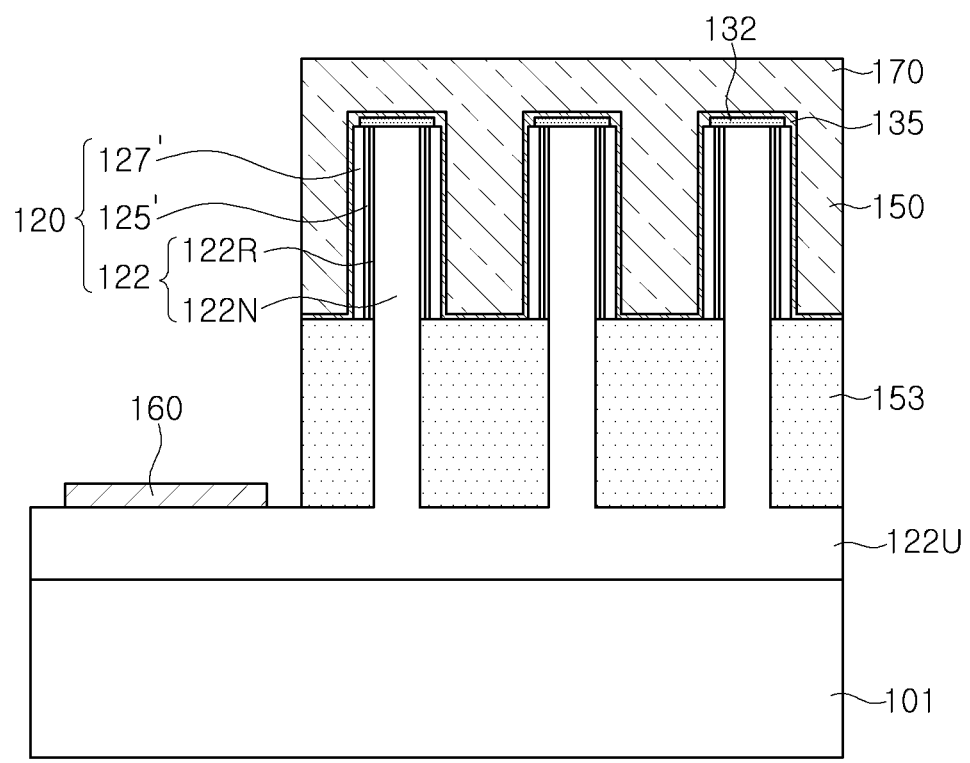
FIG. 11 is a lateral cross-sectional diagram illustrating a semiconductor light emitting diode according to an example embodiment.

The plurality of three-dimensional semiconductor light emitting structures 120 may be separated, and each three-dimensional semiconductor light emitting structure 120 may not be used as an independent light source, but may be implemented as a single semiconductor light emitting diode as illustrated in FIG. 11. FIG. 11 is a lateral cross-sectional diagram illustrating a semiconductor light emitting diode according to an example embodiment.

Referring to FIG. 11, a semiconductor light emitting diode 200 in the example embodiment may include the substrate 101, the first conductivity-type semiconductor base layer 122U disposed on the substrate 101, and a plurality of the three-dimensional semiconductor light emitting structures 120 arranged on the first conductivity-type semiconductor base layer 122U.

The plurality of three-dimensional semiconductor light emitting structures 120 in the example embodiment may be a structure in which a second electrode 170 is formed instead of the second insulating film 142' in the process illustrated in FIG. 10B. The second electrode 170 may be in contact with the transparent electrode layer 135. In an example embodiment, light generated from the active layer 125' may be emitted in a direction of the substrate 101, and in this case, the transparent electrode layer 135 may not be limited to the transparent electrode material described in the aforementioned example embodiment, and may be formed of a different ohmic contact material. For example, the transparent electrode layer 135 may include a non-transparent metal, e.g., at least one of Ag, Al, Ni, Cr, Cu, Au, Pd, Pt, Sn, W, Rh, Ir, Ru, Mg, Zn, and alloy materials including the above-mentioned elements.

Also, an etching process may be applied to expose a partial region of the first conductivity-type semiconductor base layer 122U. The first electrode 160 may be formed in the exposed region of the first conductivity-type semiconductor base layer 122U.

By way of summation and review, an example embodiment provides a three-dimensionally structured semiconductor light emitting diode having high efficiency. An example embodiment also provides a display apparatus including a three-dimensionally structured semiconductor light emitting diode.

That is, as described above, a semiconductor light emitting diode including the plurality of three-dimensional semiconductor light emitting structures 120 may be provided. According to the aforementioned example embodiments, by forming the active layer on a crystal plane (e.g., a side surface of the first conductivity-type semiconductor rod) without a defect, a three-dimensionally structured semiconductor light emitting diode having improved efficiency may be provided. By configuring each pixel using the three-dimensionally structured semiconductor light emitting diode, a high resolution display device may be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensionally structured semiconductor light emitting diode, comprising:
   a first conductivity-type semiconductor rod having first and second portions integral with each other, the first portion defining a first surface, the second portion defining a second surface opposite the first surface, and a side surface extending between the first surface and the second surface;
   an active layer and a second conductivity-type semiconductor layer sequentially disposed on the side surface of the first conductivity-type semiconductor rod, the active layer and the second conductivity-type semiconductor layer being on the second portion of the first conductivity-type semiconductor rod;
   an insulating cap layer on the second surface of the first conductivity-type semiconductor rod;
   a transparent electrode layer on the second conductivity-type semiconductor layer; and
   a passivation layer on the transparent electrode layer and exposing a portion of the transparent electrode layer, the passivation layer extending to cover a first end of the active layer and a first end of the second conductivity-type semiconductor layer adjacent to the first surface,
   wherein the first conductivity-type semiconductor rod includes a regrowth layer on the side surface, the regrowth layer being on the second portion of the first conductivity-type semiconductor rod, and a combined structure of the regrowth layer with the first conductivity-type semiconductor rod having a hexagonal columnar shape, and
   wherein the insulating cap layer overhangs the side surface of the first conductivity-type semiconductor rod.

2. The three-dimensionally structured semiconductor light emitting diode as claimed in claim 1, wherein the first portion of the first conductivity-type semiconductor rod has a width smaller than a width of the second portion.

3. The three-dimensionally structured semiconductor light emitting diode as claimed in claim 1, wherein the active layer has a second end coplanar with the second surface of the first conductivity-type semiconductor rod, the insulating cap layer covering and being in direct contact with the second end of the active layer.

4. The three-dimensionally structured semiconductor light emitting diode as claimed in claim 3, wherein the second conductivity-type semiconductor layer has a second end coplanar with the second surface of the first conductivity-type semiconductor rod, the insulating cap layer extending to the second end of the second conductivity-type semiconductor layer, and the transparent electrode layer being in direct contact with the second end of the second conductivity-type semiconductor layer and with the insulating cap layer.

5. The three-dimensionally structured semiconductor light emitting diode as claimed in claim 4, wherein the passivation layer includes a first insulating film on the second conductivity-type semiconductor layer, and a second insulating film on the first insulating film, the second insulating film extending to cover the first ends of the active layer and the second conductivity-type semiconductor layer adjacent to the first surface.

6. The three-dimensionally structured semiconductor light emitting diode as claimed in claim 1, wherein the passivation layer extends to a lateral surface of the first portion of the first conductivity-type semiconductor rod.

7. The three-dimensionally structured semiconductor light emitting diode as claimed in claim 1, wherein the exposed portion of the transparent electrode layer overlaps the insulating cap layer.

8. The three-dimensionally structured semiconductor light emitting diode as claimed in claim 1, wherein the exposed portion of the transparent electrode layer is on the side surface of the first conductivity-type semiconductor rod adjacent to the second surface.

9. The three-dimensionally structured semiconductor light emitting diode as claimed in claim 1, further comprising:
   a first connection electrode connected to the first surface of the first conductivity-type semiconductor rod; and
   a second connection electrode connected to a portion of the transparent electrode layer on the insulating cap layer.

10. The three-dimensionally structured semiconductor light emitting diode as claimed in claim 9, wherein the first connection electrode extends to a lateral surface of the first portion of the first conductivity-type semiconductor rod.

11. The three-dimensionally structured semiconductor light emitting diode as claimed in claim 1, wherein the first surface of the first conductivity-type semiconductor rod includes a cleavage plane of a first conductivity-type semiconductor.

12. The three-dimensionally structured semiconductor light emitting diode as claimed in claim 1, wherein the first conductivity-type semiconductor rod, the active layer, and the second conductivity-type semiconductor layer include nitride semiconductor single crystal.

13. The three-dimensionally structured semiconductor light emitting diode as claimed in claim 1, wherein an aspect ratio of the first conductivity-type semiconductor rod is equal to or greater than 4.

14. A three-dimensionally structured semiconductor light emitting diode, comprising:
   a first conductivity-type semiconductor rod having first and second portions integral with each other, the first portion defining a first surface, the second portion defining a second surface opposite the first surface, and a side surface extending between the first surface and the second surface;
   an active layer and a second conductivity-type semiconductor layer sequentially disposed on a lateral surface of the second portion of the first conductivity-type semiconductor rod;
   an insulating cap layer on the second surface of the first conductivity-type semiconductor rod;
   a transparent electrode layer on the insulating cap layer and on the second conductivity-type semiconductor layer; and
      a passivation layer on the transparent electrode layer, the passivation layer exposing a portion of the transparent electrode layer on the insulating cap layer,
   wherein the first conductivity-type semiconductor rod includes a regrowth layer on the side surface, the regrowth layer being on the second portion of the first conductivity-type semiconductor rod, and a combined structure of the regrowth layer with the first conductivity-type semiconductor rod having a hexagonal columnar shape, and
   wherein the insulating cap layer overhangs the side surface of the first conductivity-type semiconductor rod.

15. The three-dimensionally structured semiconductor light emitting diode as claimed in claim 14, wherein the passivation layer covers a first end of the active layer and a first end of the second conductivity-type semiconductor layer adjacent to the first surface.

16. The three-dimensionally structured semiconductor light emitting diode as claimed in claim 14, further comprising:
- a first connection electrode connected to the first surface of the first conductivity-type semiconductor rod, the first connection electrode extending to a lateral surface of the first portion adjacent to the first surface; and
- a second connection electrode connected to a first portion of the transparent electrode layer on the insulating cap layer, the second connection electrode extending to a second portion of the transparent electrode layer adjacent to the second surface.

17. The three-dimensionally structured semiconductor light emitting diode as claimed in claim 14, wherein a length of the first portion of the first conductivity-type semiconductor rod is within a range of about 20% to about 50% of a total length of the first conductivity-type semiconductor rod.

18. A display device, comprising:
- a plurality of pixels;
- a first electrode portion and a second electrode portion in each of the plurality of pixels, the first and second electrode portions being spaced apart from each other; and
- a three-dimensionally structured semiconductor light emitting diode between the first electrode portion and the second electrode portion in each of the plurality of pixels, the three-dimensionally structured semiconductor light emitting diode including:
  - a first conductivity-type semiconductor nano-rod with a first surface and a transparent electrode layer at opposite ends thereof, the first surface and the transparent electrode layer being electrically connected to the first electrode portion and the second electrode portion, respectively, and
  - an insulating cap layer directly between the first conductivity-type semiconductor rod and the transparent electrode, the insulating cap layer overhanging a side surface of the first conductivity-type semiconductor rod,
  - wherein the first conductivity-type semiconductor rod includes a regrowth layer on the side surface, a combined structure of the regrowth layer with the first conductivity-type semiconductor rod having a hexagonal columnar shape.

* * * * *